(12) United States Patent
Izumida et al.

(10) Patent No.: US 8,289,782 B2
(45) Date of Patent: Oct. 16, 2012

(54) SEMICONDUCTOR MEMORY DEVICE

(75) Inventors: Takashi Izumida, Yokohama (JP);
Tomomi Kusaka, Yokohama (JP);
Masaki Kondo, Kawasaki (JP);
Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 258 days.

(21) Appl. No.: 12/719,420

(22) Filed: Mar. 8, 2010

(65) Prior Publication Data
US 2011/0122698 A1    May 26, 2011

(30) Foreign Application Priority Data
Nov. 24, 2009   (JP) .................... 2009-266591

(51) Int. Cl.
*G11C 16/04* (2006.01)

(52) U.S. Cl. ................................. 365/185.28

(58) Field of Classification Search ............ 365/186.17–185.18, 51, 63, 185.28; 257/324, 321, 315–316, 257/E29.309
See application file for complete search history.

(56) References Cited

U.S. PATENT DOCUMENTS

| | | | |
|---|---|---|---|
| 5,639,679 | A | 6/1997 | Muramatu |
| 6,229,175 | B1 * | 5/2001 | Uchida .................... 257/315 |
| 6,943,074 | B2 | 9/2005 | Kamiya et al. |
| 7,760,552 | B2 * | 7/2010 | Miyake et al. .......... 365/185.22 |
| 2009/0014774 | A1 | 1/2009 | Ono |
| 2011/0121381 | A1 * | 5/2011 | Kanemura et al. ........... 257/321 |

FOREIGN PATENT DOCUMENTS

| | | |
|---|---|---|
| JP | 8-83855 | 3/1996 |
| JP | 10-233458 | 9/1998 |
| JP | 11-339488 | 12/1999 |
| JP | 2000-40752 | 2/2000 |
| JP | 2000-149581 | 5/2000 |
| JP | 2001-24077 | 1/2001 |
| JP | 2006-146982 | 6/2006 |
| JP | 2007-250974 | 9/2007 |
| JP | 2008-258286 | 10/2008 |
| JP | 2009-141354 | 6/2009 |

OTHER PUBLICATIONS

U.S. Appl. No. 12/644,821, filed Dec. 22, 2009, Nobutoshi Aoki, et al.
Ashawant Gupta, et al., "Accurate Determination of Ultrathin Gate Oxide Thickness and Effective Polysilicon Doping of CMOS Devices", IEEE Electron Device Letters, vol. 18, No. 12. Dec. 1997, pp. 580-582.
Office Action issued Oct. 28, 2011, in Japanese Patent Application No. 2009-266591 with English translation.
U.S. Appl. No. 12/719,193, filed Mar. 8, 2010, Kanemura, et al.
Japanese Office Action issued Feb. 24, 2012 in patent application No. 2009-266591 with English translation.
Office Action issued Jan. 13, 2012 in Korean Patent Application No. 10-2010-24050 (with English translation).

* cited by examiner

*Primary Examiner* — David Lam
(74) *Attorney, Agent, or Firm* — Oblon, Spivak, McClelland, Maier & Neustadt, L.L.P.

(57) ABSTRACT

A semiconductor memory device according to an embodiment of the present invention includes a substrate, a gate insulator formed on the substrate and serving as an F-N (Fowler-Nordheim) tunneling film, a first floating gate formed on the gate insulator, a first intergate insulator formed on the first floating gate and serving as an F-N tunneling film, a second floating gate formed on the first intergate insulator, a second intergate insulator formed on the second floating gate and serving as a charge blocking film, and a control gate formed on the second intergate insulator.

20 Claims, 17 Drawing Sheets

US 8,289,782 B2

SEMICONDUCTOR MEMORY DEVICE

CROSS REFERENCE TO RELATED APPLICATION

This application is based upon and claims the benefit of priority from the prior Japanese Patent Application No. 2009-266591, filed on Nov. 24, 2009, the entire contents of which are incorporated herein by reference.

BACKGROUND

Memory cells in a semiconductor memory device such as an NAND flash memory are expected to be miniaturized in response to a request for a larger capacity and a lower cost per bit.

However, if the memory cells are miniaturized, the following kinds of degradation in characteristics cannot be avoided. First, when the memory cells are miniaturized, an increase in coupling between adjacent cells is a problem. Secondly, when the memory cells are miniaturized, variations in coupling ratio due to concave portions of control gates are a problem. Therefore, the miniaturization of the memory cells leads to a poorer performance of the NAND flash memory.

SUMMARY

An aspect of the present invention is, for example, a semiconductor memory device including a substrate, a gate insulator formed on the substrate and serving as an F-N (Fowler-Nordheim) tunneling film, a first floating gate formed on the gate insulator, a first intergate insulator formed on the first floating gate and serving as an F-N tunneling film, a second floating gate formed on the first intergate insulator, a second intergate insulator formed on the second floating gate and serving as a charge blocking film, and a control gate formed on the second intergate insulator.

DETAILED DESCRIPTION

JP-A 2009-141354 discloses an example of a nonvolatile memory device including a floating gate which includes two layers. In this device, an insulating film is formed between those layers, and the insulating film has such a thickness as to enable direct tunneling. Therefore, it is difficult to retain charges in the upper layer of the floating gate.

JP-A 2007-250974 discloses an example of a nonvolatile semiconductor memory device including a plurality of floating regions. In this device, the type and the thickness of an insulating film formed between a semiconductor substrate and the floating regions are the same as the type and the thickness of an insulating film formed between the floating regions and a gate electrode (control gate). Therefore, when data is to be written in a memory cell, the same voltage is applied to those insulating films, so that charges injected from the substrate into the floating regions escape to the gate electrode.

The following is a description of embodiments of the present invention, with reference to the accompanying drawings.

First Embodiment

Figure 1:
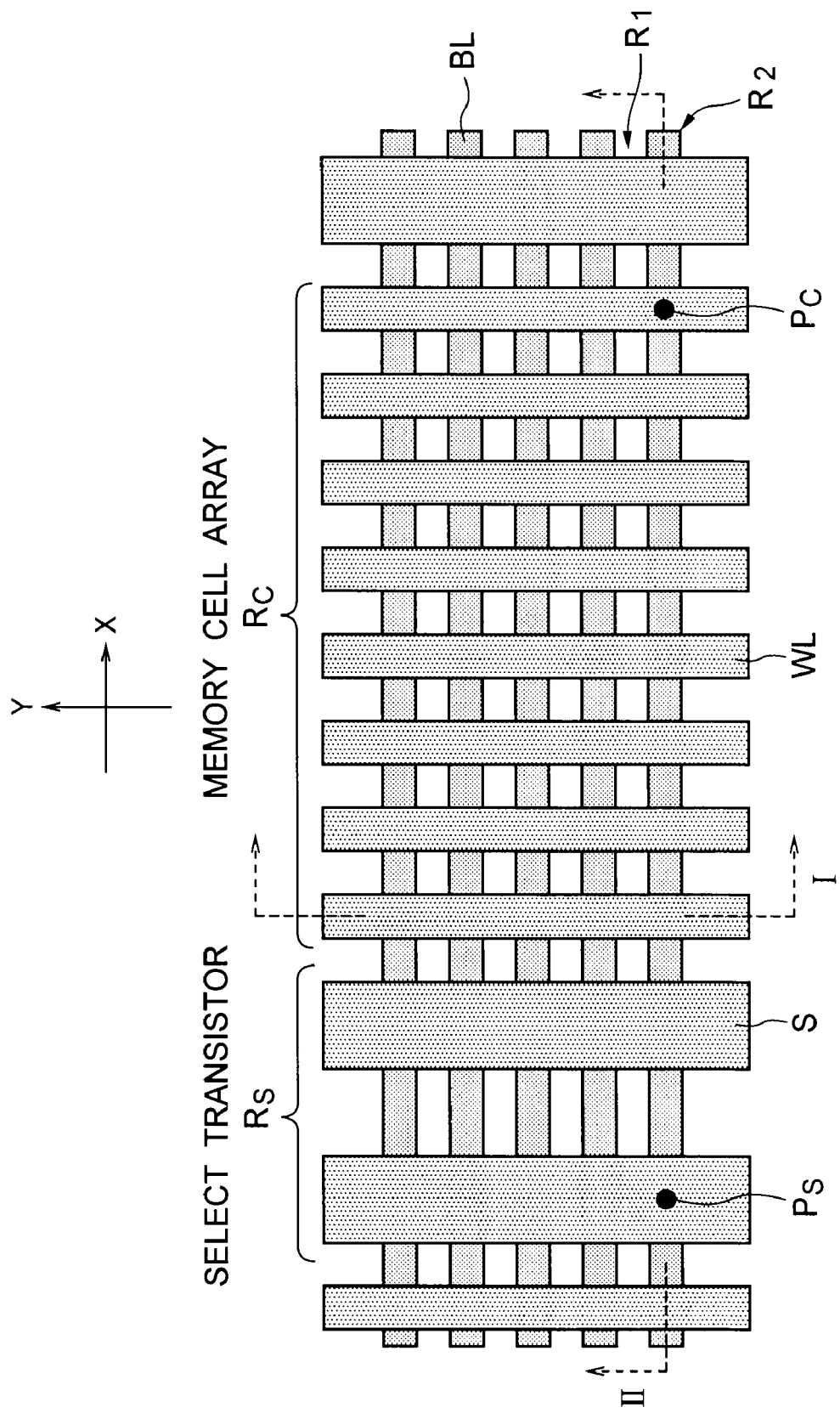
FIG. 1 is a plan view schematically showing a configuration of a semiconductor memory device according to a first embodiment.

FIG. 1 is a plan view showing a configuration of a semiconductor memory device according to a first embodiment. The semiconductor memory device of FIG. 1 is an NAND flash memory.

In FIG. 1, Rc represents a memory cell array region, and Rs represents a select transistor region. FIG. 1 further shows bitlines BL extending in a first direction parallel to a surface of a substrate, and wordlines WL and selectlines S extending in a second direction parallel to the surface of the substrate. The first and second directions are respectively represented by arrows X and Y, which are perpendicular to each other.

In the memory cell array region Rc, cell transistors (memory cells) are provided at intersection points Pc between the bitlines BL and the wordlines WL. In the select transistor region Rs, select transistors are provided at intersection points Ps between the bitlines BL and the selectlines S. Each cell transistor is electrically connected to one of the bitlines BL and one of the wordlines WL, and each select transistor is electrically connected to one of the bitlines BL and one of the selectlines S.

FIG. 1 further shows isolation regions $R_1$ and active regions (device regions) $R_2$. The isolation regions $R_1$ and the active regions $R_2$ extend in the X direction, and are provided alternately along the Y direction in the substrate. Each of the cell transistors and the select transistors is formed on an active region $R_2$.

Figure 2:
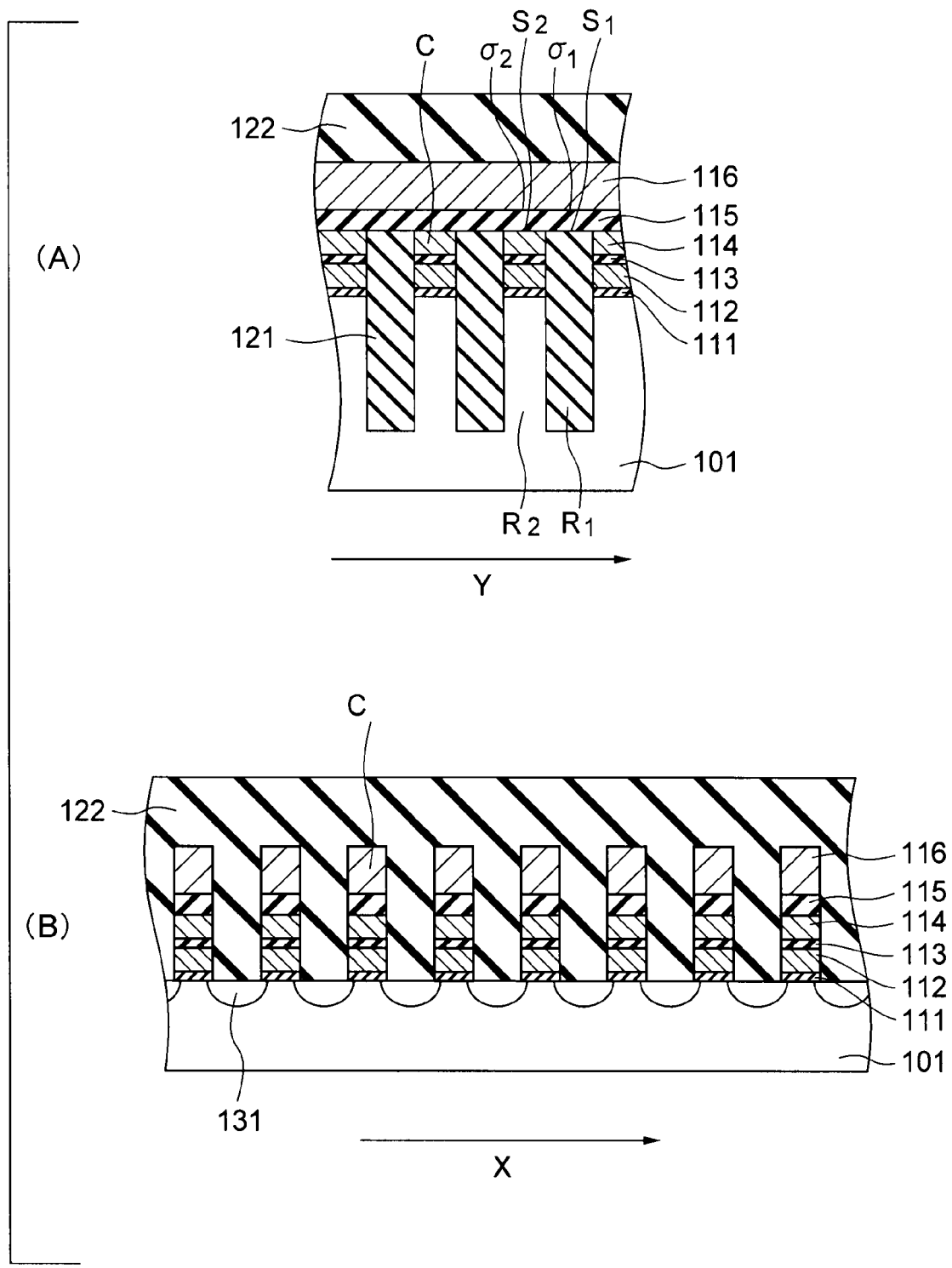
FIG. 2 illustrates cross sectional views showing a configuration of the semiconductor memory device according to the first embodiment.

FIG. 2 illustrates cross sectional views showing a configuration of the semiconductor memory device according to the first embodiment.

FIG. 2(A) shows an AA (Active Area) section of the semiconductor memory device along a section line I of FIG. 1. FIG. 2(B) shows a GC (Gate Conductor) section of the semiconductor memory device along a section line II of FIG. 1. FIGS. 2(A) and 2(B) are cross sectional views of the memory cell array region Rc, and each cell transistor is represented by C.

Each cell transistor C is formed on a substrate 101, and includes a tunneling insulator 111, a lower floating gate 112, an IFD (Inter Floating-Gate Dielectric) film 113, an upper floating gate 114, an IPD (Inter Poly-Si Dielectric) film 115, and a control gate 116 stacked in this order on the substrate 101. The IFD film 113 and the IPD film 115 may be referred to as first and second intergate insulators, respectively.

The substrate 101 is a semiconductor substrate such as a silicon substrate, for example. As shown in FIG. 2(A), isolation insulators 121 are formed near the surface of the substrate 101, so that the isolation regions $R_1$ and the active regions $R_2$ are formed in the substrate 101. As shown in FIG. 2(B), an inter layer dielectric 122 is formed on the substrate 101 to cover the cell transistors C, and source/drain diffusion layers 131 are formed in the substrate 101 to sandwich the respective cell transistors C and electrically connect the cell transistors C in series. The isolation insulators 121 and the inter layer dielectric 122 are silicon oxides, for example.

The tunneling insulator 111 is formed on the substrate 101, more specifically, on an active region $R_2$. The tunneling insulator 111 is an example of a gate insulator of the present embodiment. The tunneling insulator 111 is a silicon oxide formed by thermal oxidation, for example. The tunneling insulator 111 is also denoted by a $T_{ox}$ film.

The tunneling insulator 111 in this embodiment serves as an F-N (Fowler-Nordheim) tunneling film. An F-N tunneling film is an insulating film having such a thickness that a charge transmission by virtue of F-N tunneling is dominant. The thickness of the tunneling insulator 111 is equal to or greater than 3 nm (preferably 3 to 5 nm) in equivalent silicon oxide thickness, i.e., in EOT (Equivalent Oxide Thickness), for example. The F-N tunneling film will be described below in detail.

The lower floating gate 112 is formed on the tunneling insulator 111. The lower floating gate 112 is an example of a first floating gate of the present embodiment. The lower floating gate 112 serves as a charge storage film for storing charges. The lower floating gate 112 is a polysilicon layer, for example. The lower floating gate 112 is also denoted by $FG_1$.

The IFD film 113 is an insulating film formed on the lower floating gate 112. The IFD film 113 is an example of a first intergate insulator of the present embodiment. The IFD film 113 is a silicon oxide formed by thermal oxidation, for example.

The IFD film 113 in this embodiment serves as an F-N tunneling film, similarly to the tunneling insulator 111. The thickness of the IFD film 113 is equal to or greater than 3 nm (preferably 3 to 5 nm) in EOT, for example. The thickness of the tunneling insulator 111 and the thickness of the IFD film 113 are preferably equal to each other in effective thickness, i.e., in EOT, but may not be equal to each other in physical thickness.

The upper floating gate 114 is formed on the IFD film 113. The upper floating gate 114 is an example of a second floating gate of the present embodiment. The upper floating gate 114 serves as a charge storage film for storing charges, similarly to the lower floating gate 112. The upper floating gate 114 is a polysilicon layer, for example. The upper floating gate 114 is also denoted by $FG_2$.

The IPD film 115 is an insulating film formed on the upper floating gate 114. The IPD film 115 is an example of a second intergate insulator of the present embodiment. The IPD film 115 is an ONO stack film including a lower silicon oxide layer, a silicon nitride layer, and an upper silicon oxide layer, for example. The IPD film 115 serves as a charge blocking film which prevents (blocks) charges injected from the lower floating gate 112 into the upper floating gate 114 from escaping into the control gate 116. The thickness of the IPD film 115 of this embodiment is greater than the thickness of the tunneling insulator 111 and the thickness of the IFD film 113 in effective thickness, i.e., in EOT.

The control gate 116 is formed on the IPD film 115. The control gate 116 is an example of a control gate of the present embodiment. The control gate 116 serves as a control electrode for controlling the potentials of the cell transistors C. The control gate 116 is a polysilicon layer, for example. The control gate 116 is also denoted by CG.

Each of the tunneling insulator 111, the IFD film 113, and the IPD film 115 may be a single-layer film including only one insulating layer, or may be a stack film including two or more insulating layers. An example of the single-layer film includes an $SiO_2$ layer, and an example of the stack film includes a double-layer film including an $SiO_2$ layer and a high-k insulating layer (such as an $Si_3N_4$ layer).

Each of the cell transistors C includes two floating gates 112 and 114 in this embodiment, but may include three or more floating gates. If each cell transistor C includes N floating gates (N is an integer of 2 or greater), each cell transistor C further includes N−1 IFD films, and the floating gates and the IFD films are alternately stacked.

The cross sectional shapes of the IPD film 115 and the control gate 116 are now described.

As shown in FIG. 2(A), the tunneling insulator 111, the lower floating gate 112, the IFD film 113, and the upper floating gate 114 are divided into the cell transistors C. In FIG. 2(A), the tunneling insulator 111, the lower floating gate 112, the IFD film 113, and the upper floating gate 114 are stacked on an active region $R_2$, and are formed between isolation insulators 121.

On the other hand, the IPD film 115 and the control gate 116 are shared by the cell transistors C adjacent to one another in the Y direction (a direction parallel to the wordlines WL). In FIG. 2(A), the height of the upper surface $S_1$ of each isolation insulator 121 is equal to the height of the upper surface $S_2$ of the upper floating gate 114. As a result, the lower surface of the IPD film 115 and the lower surface of the control gate 116 are flat, and the height of the lower surface $\sigma_1$ of the control gate 116 between the cell transistors C is equal to the height of the lower surface $\sigma_2$ of the control gate 116 on the lower and upper floating gates 112 and 114.

Next, a direct tunneling film and an F-N tunneling film are described.

Figure 3:
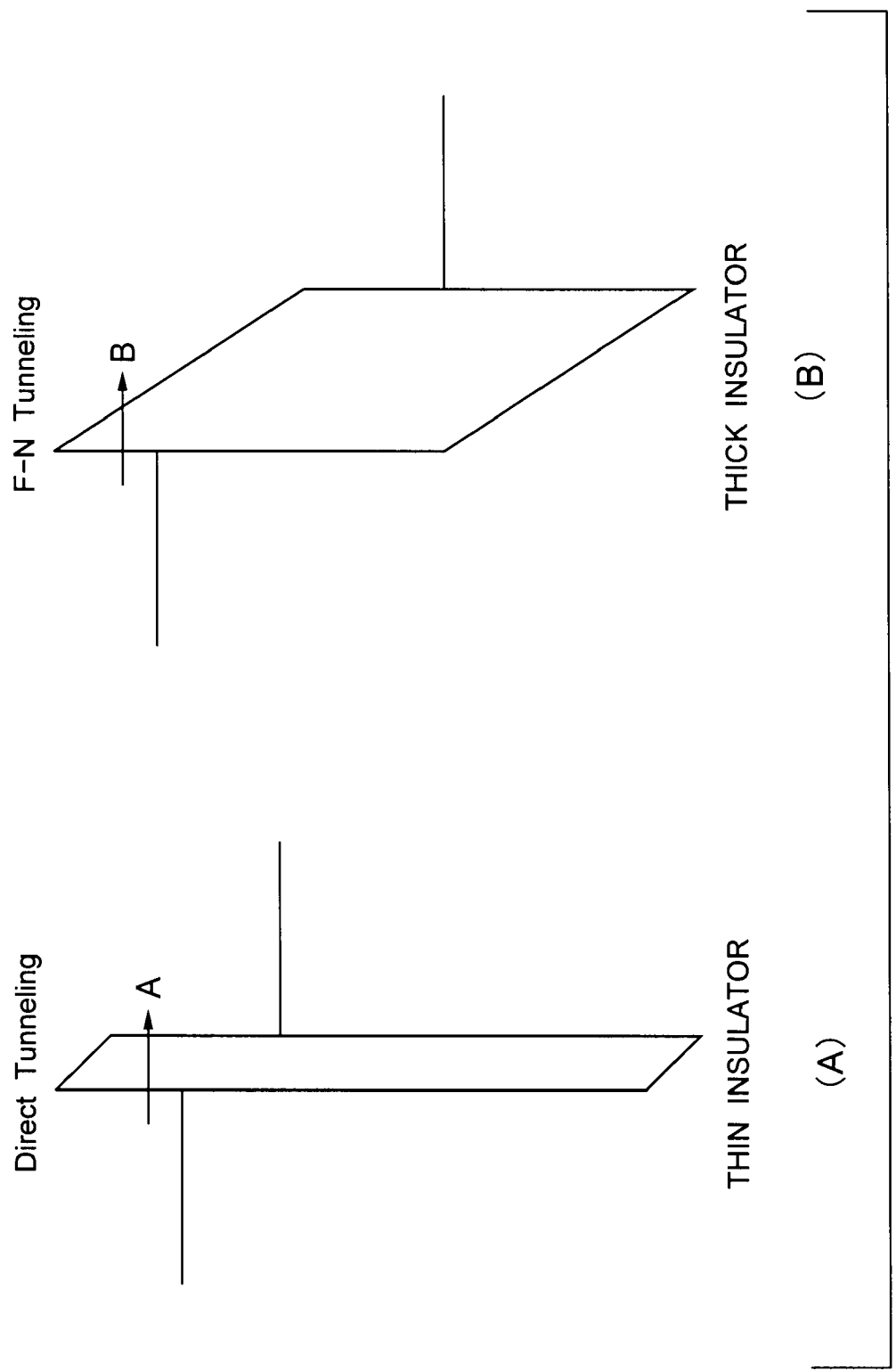
FIG. 3 illustrates conceptual diagrams for explaining a direct tunneling film and an F-N tunneling film.

FIG. 3 illustrates conceptual diagrams for explaining a direct tunneling film and an F-N tunneling film. The horizontal direction in FIG. 3 is the thickness direction of each insulating film, and the vertical direction in FIG. 3 is the height direction of the potential inside and outside of each insulating film.

FIG. 3(A) illustrates an insulating film having a small thickness. The insulating film illustrated in FIG. 3(A) is a direct tunneling film. A direct tunneling film is an insulating film having such a thickness that a charge transmission due to direct tunneling is dominant. Charges located near the direct tunneling film cause direct tunneling at a certain probability, and pass through the direct tunneling film, as indicated by an arrow A in FIG. 3(A).

FIG. 3(B) illustrates an insulating film having a large thickness. The insulating film illustrated in FIG. 3(B) is an F-N tunneling film. As described above, an F-N tunneling film is an insulating film having such a thickness that a charge transmission due to F-N tunneling is dominant. The probability that charges located near the F-N tunneling film pass through the F-N tunneling film due to direct tunneling is low. However, by applying an electric field to the F-N tunneling film, the potential barrier of the F-N tunneling film is tilted, and the barrier becomes thinner. As a result, the charges located near the F-N tunneling film cause F-N tunneling, and pass through the F-N tunneling film, as indicated by an arrow B in FIG. 3(B).

Figure 4:
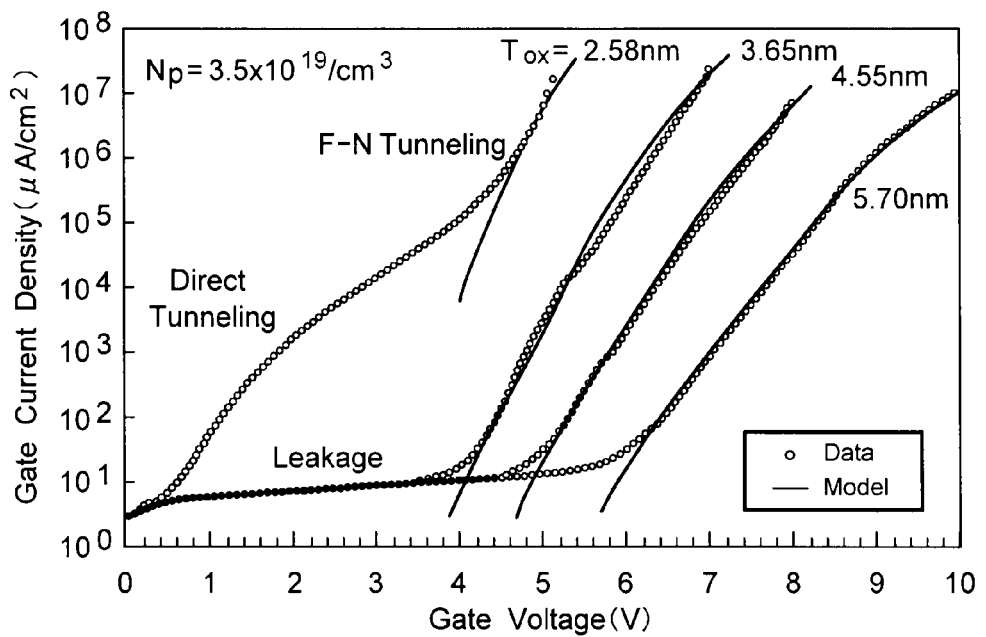
FIG. 4 is a graph showing measured values of direct tunneling currents and F-N tunneling currents.

FIG. 4 is a graph showing measured values of direct tunneling currents and F-N tunneling currents. The horizontal axis in FIG. 4 indicates a gate voltage [V] to be applied to an n-MOSFET of n$^+$-poly, and the vertical axis in FIG. 4 indicates a current density [$\mu$A/cm$^2$] of a gate current in the n-MOSFET.

FIG. 4 shows measured values of gate currents including direct tunneling currents and F-N tunneling currents, and theoretical values of F-N tunneling currents in cases where the thicknesses of a $T_{ox}$ film (tunneling insulator) of the n-MOSFET are 2.58 nm, 3.65 nm, 4.55 nm, and 5.70 nm, and the $T_{ox}$ film is a silicon oxide film.

As can be seen from FIG. 4, where the thickness of the $T_{ox}$ film is 3.65 nm, 4.55 nm, or 5.70 nm, the gate current is substantially equal to the F-N tunneling current in almost all the gate voltage region higher than a gate voltage with which the gate current starts flowing. On the other hand, where the thickness of the $T_{ox}$ film is 2.58 nm, the gate current is equal to the F-N tunneling current only in a region higher than a predetermined voltage within the above-mentioned gate voltage region.

It is understood from the above that a charge transmission due to F-N tunneling is dominant in such an insulating film that has an effective thickness of 3 nm or greater. Therefore, the insulating film of 3 nm or greater in effective thickness can be regarded as an F-N tunneling film. Therefore, in this embodiment, the effective thickness of the tunneling insulator 111 and the effective thickness of the IFD film 113 are set at 3 nm or greater. With this arrangement, the tunneling insulator 111 and the IFD film 113 serve as F-N tunneling films.

The graph shown in FIG. 4 is described in greater detail by A. Gupta et al., in "IEEE Trans. Electron Device Lett. 18 (1977) 580".

As described above, in this embodiment, the floating gate of each cell transistor is formed with the lower floating gate 112 and the upper floating gate 114, and the IFD film 113 is formed between the lower floating gate 112 and the upper floating gate 114. With this arrangement, the coupling ratio between the upper floating gate 114 and the control gate 116 becomes higher, and the electric field to be applied to the tunneling insulator 111 increases. Accordingly, the write characteristics of the cell transistors are improved. Further, the capacity of each cell increases, and the coupling ratio becomes higher. Accordingly, interference between adjacent cells is suppressed.

Further, in this embodiment, the tunneling insulator 111 and the IFD film 113 are F-N tunneling films. With this arrangement, charges in the lower floating gate 112 are prevented from flowing into the substrate 101, and charges in the upper floating gate 114 are prevented from flowing into the lower floating gate 112. As a result, with respect to the charges stored in the floating gates 112 and 114, the proportion of the charges stored in the floating gate 114 is larger, and the proportion of the charges stored in the lower floating gate 112 is smaller in this embodiment. Accordingly, charges can be retained in the cell transistors over a long period of time in this embodiment.

Further, in this embodiment, the IPD film 115 serves as a charge blocking film. Accordingly, charges injected from the substrate 101 into the floating gates 112 and 114 can be prevented from escaping to the control gate 116.

Further, in this embodiment, the IPD film 115 and the control gate 116 are shared by the cell transistors adjacent to one another in a direction parallel to the wordlines. Furthermore, the lower surface of the IPD film 115 and the lower surface of the control gate 116 are flat, and the height of the lower surface of the control gate 116 between the cell transistors is substantially equal to the height of the lower surface of the control gate 116 on the floating gates 112 and 114. Accordingly, the capacitance between adjacent cells can be made smaller, and variations in concave portions of the control gate 116 are avoided.

Further, in this embodiment, the thicknesses of the tunneling insulator 111 and the IFD film 113 are set at 3 nm or greater in EOT. With this arrangement, those insulating films can be F-N tunneling films. Furthermore, the thicknesses of the tunneling insulator 111 and the IFD film 113 may be set in the range of 3 nm to 5 nm in EOT in this embodiment. With such thicknesses, those insulating films can serve as F-N tunneling films in which writing by F-N tunneling is readily performed.

Further, in this embodiment, the effective thickness of the IPD film 115 is greater than the effective thicknesses of the tunneling insulator 111 and the IFD film 113 serving as F-N tunneling films. With this arrangement, the IPD film 115 can serve as a charge blocking film.

The structure of the semiconductor memory device of this embodiment described above is suitable for a miniaturization of the memory cells (cell transistors). According to this embodiment, a degradation of a performance of the semiconductor memory device can be restrained, while the memory cells can be miniaturized. More specifically, a degradation in write characteristics, an adjacent cell interference, a charge escaping and the like can be restrained, while the memory cells can be miniaturized.

Referring now to FIG. 2, writing and reading operations to be performed on the cell transistors are described. In the writing and reading operations, a cell transistor (selected cell) on which writing or reading is to be performed is selected from the cell transistors arranged in the memory cell array region Rc, and predetermined voltages are applied to the selected cell and unselected cells.

In this embodiment, when data is to be written into the selected cell, charges are injected from the substrate 101 into the lower floating gate 112 and the upper floating gate 114 of the selected cell, and the charges are stored in these floating gates 112 and 114. In this embodiment, the charges are stored mainly in the upper floating gate 114, as mentioned above. When the data is to be written into the selected cell, a program voltage (write voltage) Vpgm is applied to a wordline electrically connected to the selected cell.

Figure 5:
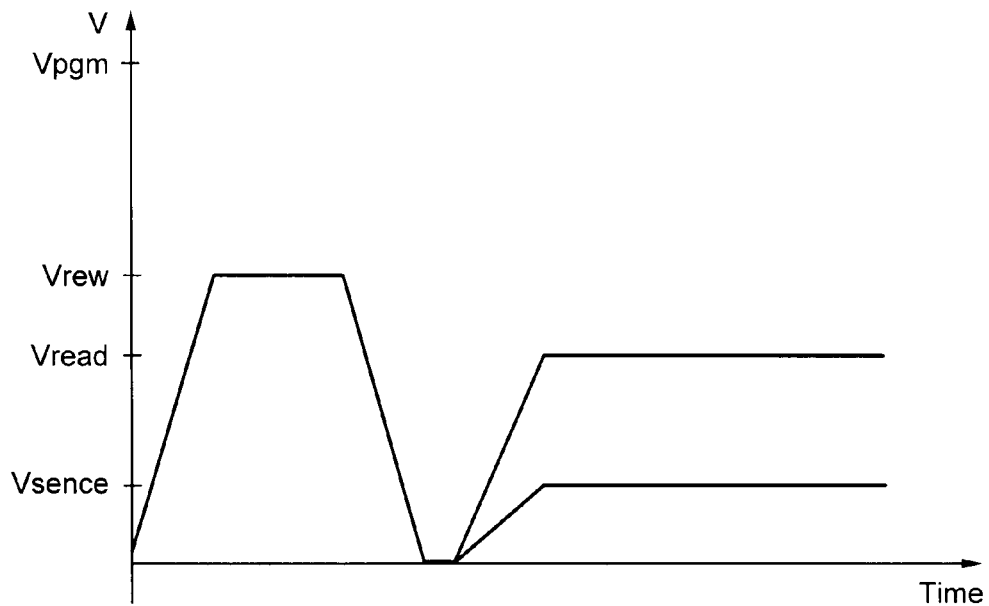
FIG. 5 is a timing chart showing a flow of a reading operation.

On the other hand, when the data is to be read from the selected cell, the reading is performed by a read control illustrated in FIG. 5. FIG. 5 is a timing chart showing a flow of the reading operation.

In this embodiment, charges are stored not only in the upper floating gate 114 but also in the lower floating gate 112. The charges stored in the upper floating gate 114 might partially escape to the lower floating gate 112 before the reading. The charges stored in the lower floating gate 112 might change the threshold voltage of the cell transistors.

Therefore, a voltage Vrew higher than a read voltage Vread is applied to the wordline electrically connected to the selected cell, prior to the data reading from the selected cell in this embodiment (see FIG. 5). By doing so, the charges in the lower floating gate 112 of the selected cell are returned to the upper floating gate 114 of the selected cell.

Then, the read voltage Vread is applied to the wordline electrically connected to the selected cell, and a sense voltage Vsense smaller than the read voltage Vread is applied to a bitline electrically connected to the selected cell, so as to perform the reading (see FIG. 5). In this manner, a data reading from the selected cell can be performed with an accurate threshold voltage.

In this embodiment, the voltage Vrew (rewrite voltage) is set larger than the read voltage Vread, and smaller than the program voltage Vpgm.

The following is a description of a method of manufacturing the semiconductor memory device according to this embodiment.

Figure 6:
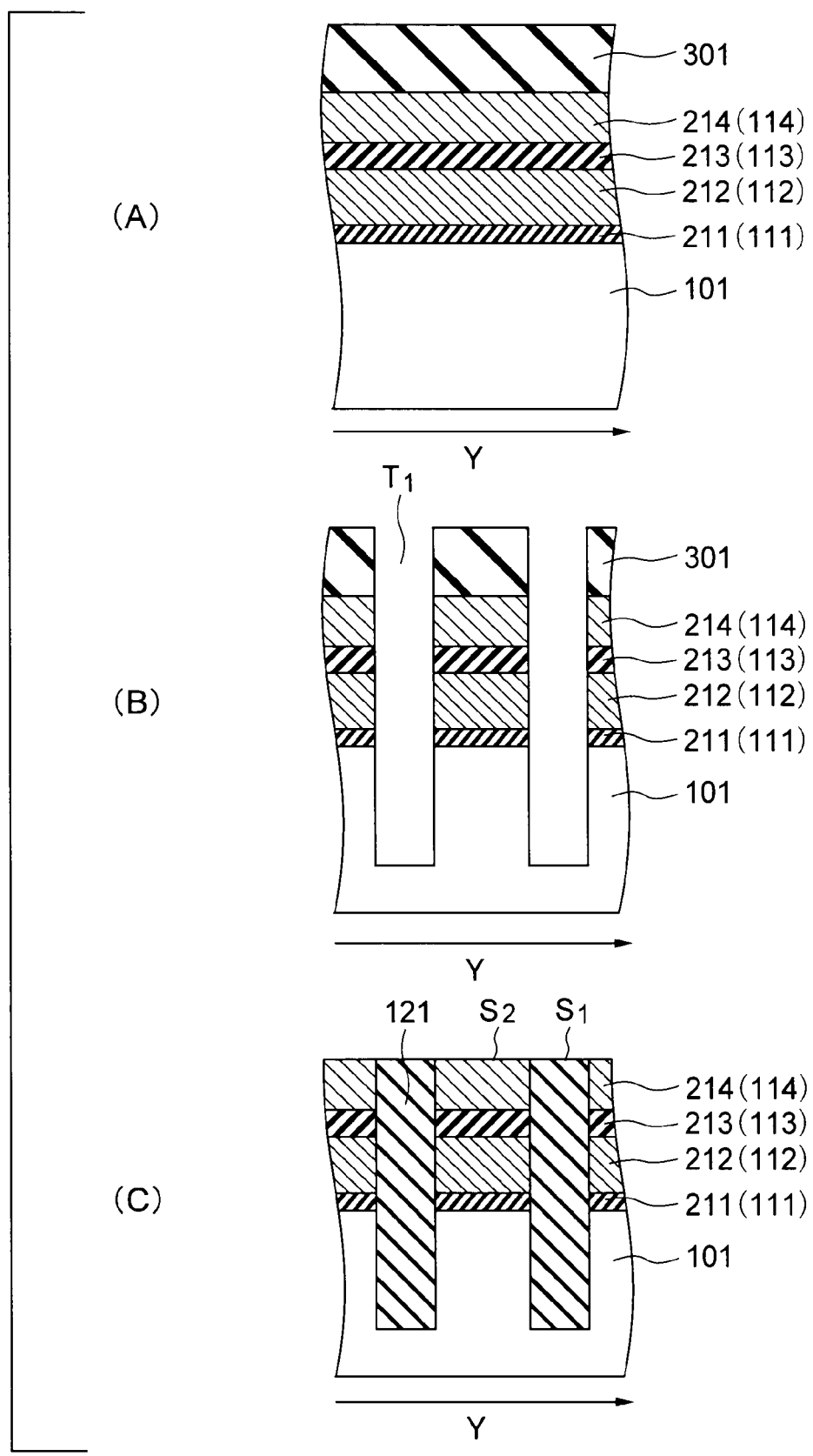
FIGS. 6 and 7 illustrate cross sectional views for explaining a method of manufacturing the semiconductor memory device according to the first embodiment.
Figure 7:
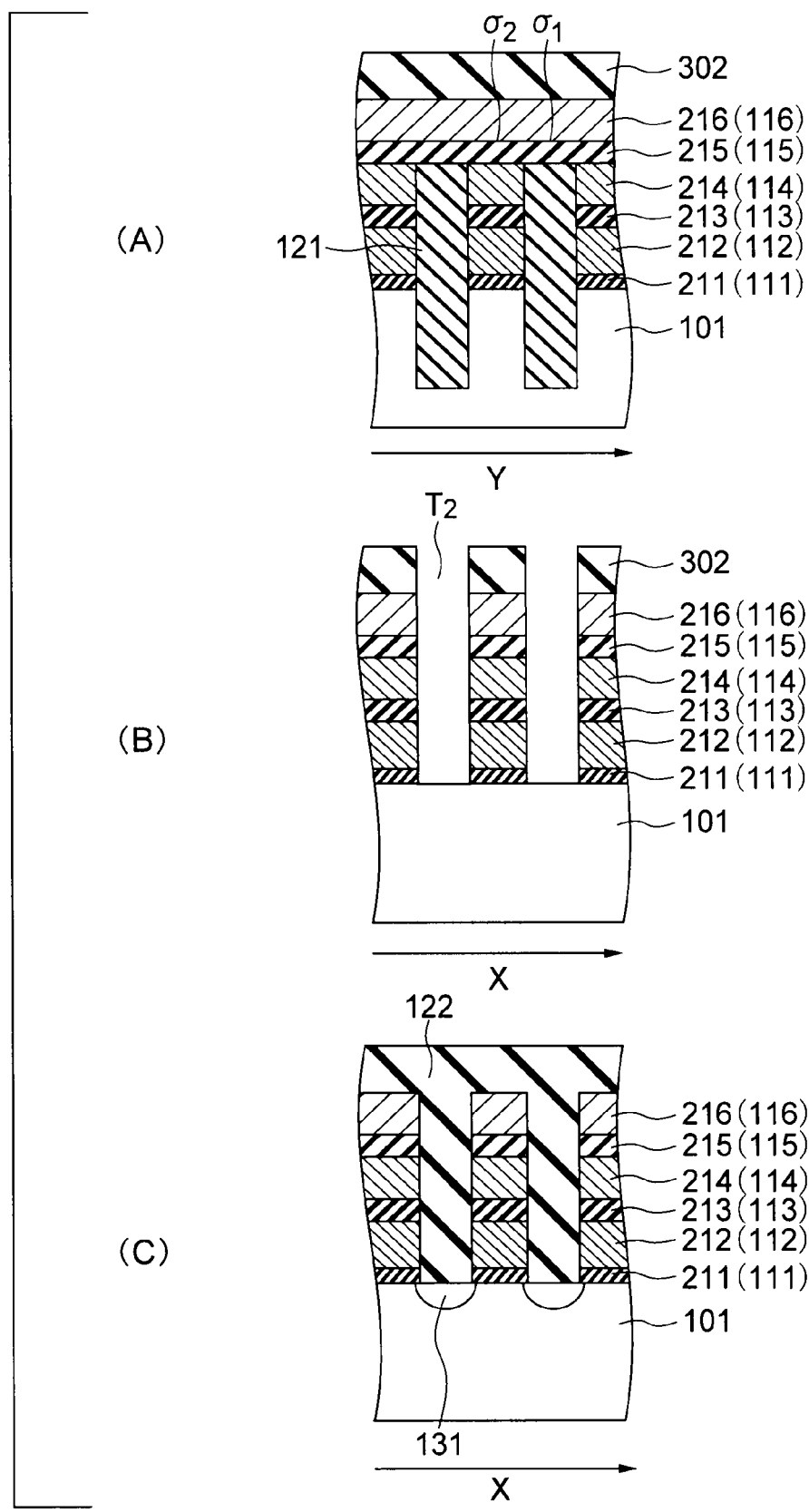

FIGS. 6 and 7 illustrate cross sectional views for explaining the method of manufacturing the semiconductor memory device according to the first embodiment.

First, as shown in FIG. 6(A), a first insulating film 211 as a material of the tunneling insulator 111, a first electrode layer 212 as a material of the lower floating gate 112, a second insulating film 213 as a material of the IFD film 113, a second electrode layer 214 as a material of the upper floating gate 114, and a first mask layer 301 are stacked in this order on the substrate 101. The first and second insulating films 211 and 213 are silicon oxide layers formed by thermal oxidation, the first and second electrode layers 212 and 214 are polysilicon layers, and the first mask layer 301 is a silicon oxide layer, for example.

Next, the first mask layer 301 is patterned by lithography and etching (FIG. 6(B)). Then, first trenches $T_1$ which are isolation trenches are formed by etching using the first mask layer 301. The first trenches $T_1$ extend in the X direction (direction parallel to the bitlines BL), and penetrate through the second electrode layer 214, the second insulating film 213, the first electrode layer 212, and the first insulating film 211. The first trenches $T_1$ reach the inside of the substrate 101, and the bottom surfaces of the first trenches $T_1$ are lower than the upper surface of the substrate 101.

Next, as shown in FIG. 6(C), the isolation insulators 121 are buried in the first trenches $T_1$. The material of the isolation insulators 121 is silicon oxide, for example. The isolation insulators 121 are buried by depositing the material of the isolation insulators 121 on the entire surface of the substrate 101, and planarizing the surface of the material by CMP (Chemical Mechanical Polishing), for example. The CMP is performed until the height of the upper surface $S_1$ of each isolation insulator 121 becomes the same as the height of the upper surface $S_2$ of the second electrode layer 214.

Next, as shown in FIG. 7(A), a third insulating film 215 as a material of the IPD film 115, a third electrode layer 216 as a material of the control gate 116, and a second mask layer 302 are stacked in this order on the second electrode layer 214 and the isolation insulators 121. The third insulating film 215 is an ONO stack layer, the third electrode layer 216 is a polysilicon layer, and the second mask layer 302 is a silicon oxide layer, for example. In FIG. 7(A), since the height of the upper surface $S_1$ is equal to the height of the lower surface $S_2$, the height of the lower surface $\sigma_1$ of a part of the third electrode layer 216 between the cell transistors is the same as the height of the lower surface $\sigma_2$ of a part of the third electrode layer 216 on the first and second electrode layers 212 and 214.

Next, the second mask layer 302 is patterned by lithography and etching (FIG. 7(B)). Then, second trenches $T_2$ are formed by etching using the second mask layer 302. The second trenches $T_2$ extend in the Y direction (direction parallel to the wordlines WL), and penetrate through the third electrode layer 216, the third insulating film 215, the second electrode layer 214, the second insulating film 213, the first electrode layer 212, and the first insulating film 211. In this embodiment, the heights of the bottom surfaces of the second trenches $T_2$ are equal to the height of the upper surface of the substrate 101.

In this way, the cell transistors, each of which includes the tunneling insulator 111, the lower floating gate 112, the IFD film 113, the upper floating gate 114, the IPD film 115, and the control gate 116, are formed on the substrate 101. Then, the source/drain diffusion layers 131 are formed in the substrate 101, and the inter layer dielectric 122 is formed on the substrate 101 to cover the cell transistors (FIG. 7(C)). Furthermore, contact plugs, via plugs, and various interconnect layers are formed on the substrate 101.

As described above, in this embodiment, the floating gate of each cell transistor is formed with the lower floating gate 112 and the upper floating gate 114, and the IFD film 113 is formed between the lower floating gate 112 and the upper floating gate 114. Further, the tunneling insulator 111 and the IFD film 113 are F-N tunneling films, and the IPD film 115 is a charge blocking film. With this arrangement, the memory cells can be miniaturized, while the degradation of the performance of the semiconductor memory device is prevented. For example, the memory cells can be miniaturized, while the degradation of the write characteristics, the adjacent cell interference, the charge escaping and the like are restrained. As for the write characteristics, the coupling ratio between the upper floating gate 114 and the control gate 116 becomes higher, and the electric field applied to the tunneling insulator 111 increases in this embodiment. Accordingly, the write characteristics of the cell transistors are improved in this embodiment. As for the adjacent cell interference, the capacity of each cell increases, and the coupling ratio becomes higher. Accordingly, the adjacent cell interference is suppressed.

In the following, second and third embodiments of the present invention are described. Since those embodiments are modifications of the first embodiment, differences from the first embodiment are mainly described with respect to those embodiments.

Second Embodiment

Figure 8:
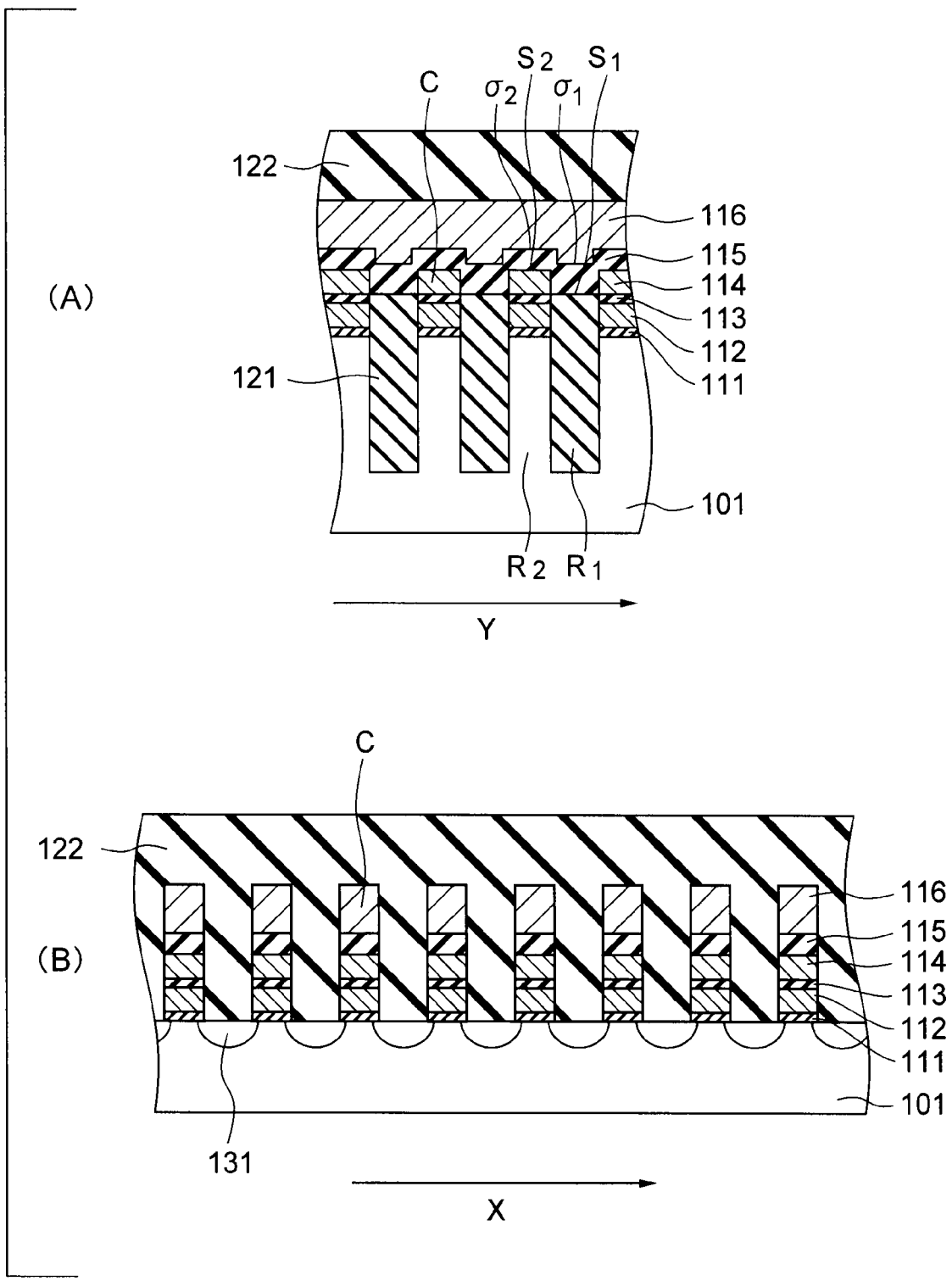
FIG. 8 illustrates cross sectional views showing a configuration of a semiconductor memory device according to a second embodiment.

FIG. 8 illustrates cross sectional views showing a configuration of a semiconductor memory device according to a second embodiment.

In FIG. 8(A), the IPD film 115 and the control gate 116 are shared by the cell transistors C adjacent to one another in the Y direction (direction parallel to the wordlines WL), similarly to those in FIG. 2(A). However, in FIG. 8(A), the upper surface $S_1$ of each isolation insulator 121 is lower than the upper surface $S_2$ of the upper floating gate 114, differently from that in FIG. 2(A). As a result, in FIG. 8(A), the lower surface $\sigma_1$ of the control gate 116 between the cell transistors C is lower than the lower surface $\sigma_2$ of the control gate 116 on the lower and upper floating gates 112 and 114.

In this embodiment, the height of the upper surface of each isolation insulator 121 is equal to the height of the upper surface of the IFD film 113. However, the height of the upper surface of each isolation insulator 121 may be between the height of the upper surface of the upper floating gate 114 and the height of the upper surface of the IFD film 113.

In this embodiment, the thickness of the IPD film 115 between the cell transistors C may differ from the thickness of the IPD film 115 on the lower and upper floating gates 112 and 114. In this embodiment, the thickness of the IPD film 115 between the cell transistors C and the thickness of the IPD film 115 on the lower and upper floating gates 112 and 114 are set greater than the thickness of the tunneling insulator 111 and the thickness of the IFD film 113 in the effective thickness.

As described above, in this embodiment, the IPD film 115 and the control gate 116 are shared by cell transistors adjacent to one another in the direction parallel to the wordlines. Further, the lower surface of the control gate 116 between the cell transistors is lower than the lower surface of the control gate 116 on the cell transistors (i.e., on the lower and upper floating gates 112 and 114), so that the control gate 116 fills the spaces between the cell transistors. With this arrangement, the capacitance between the upper floating gate 114 and the control gate 116 can be increased, and the capacitive coupling can be made stronger. Accordingly, the write characteristics of the cell transistors can be improved in this embodiment.

The following is a description of a method of manufacturing the semiconductor memory device according to this embodiment.

Figure 9:
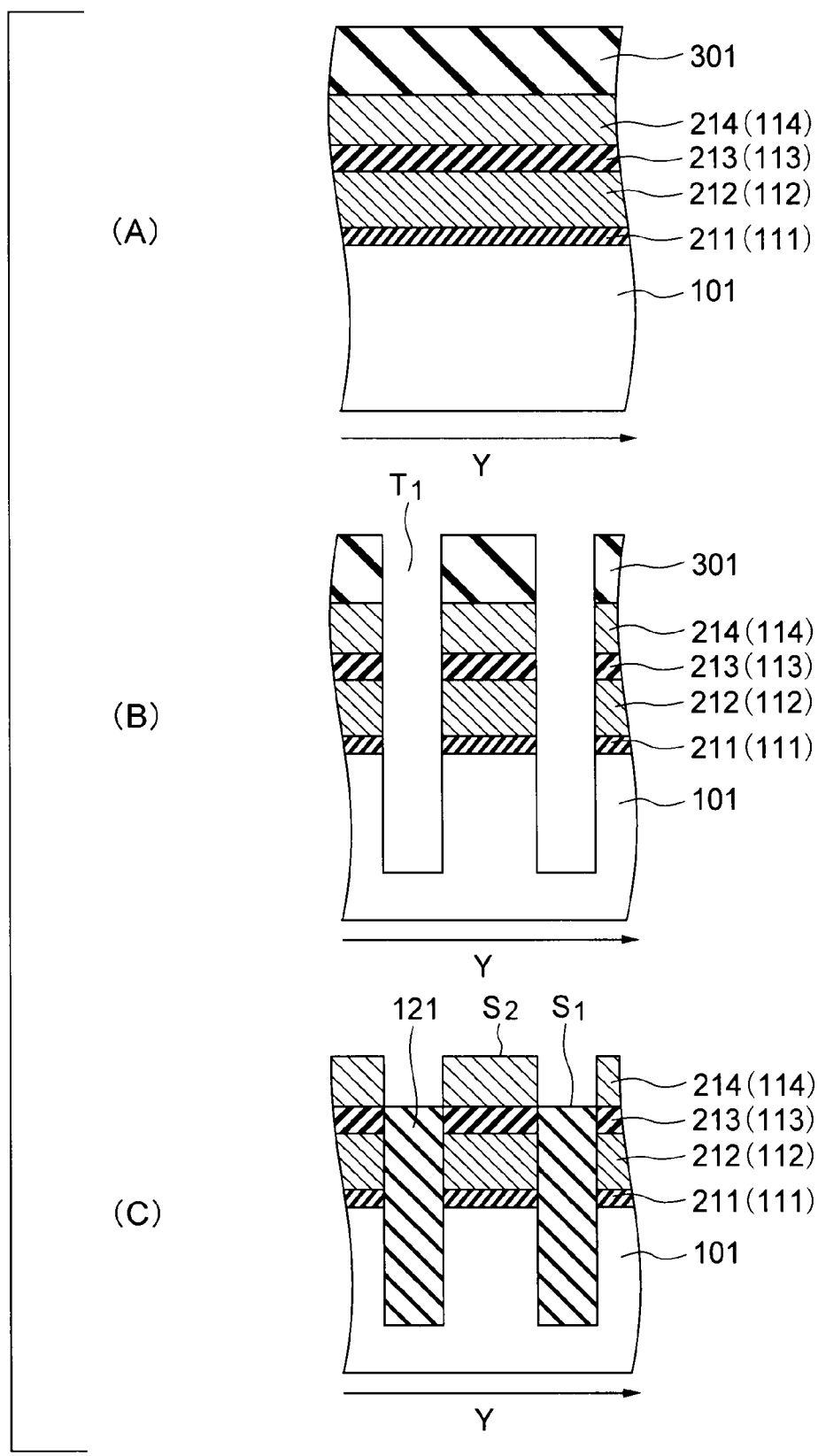
FIGS. 9 and 10 illustrate cross sectional views for explaining a method of manufacturing the semiconductor memory device according to the second embodiment.
Figure 10:
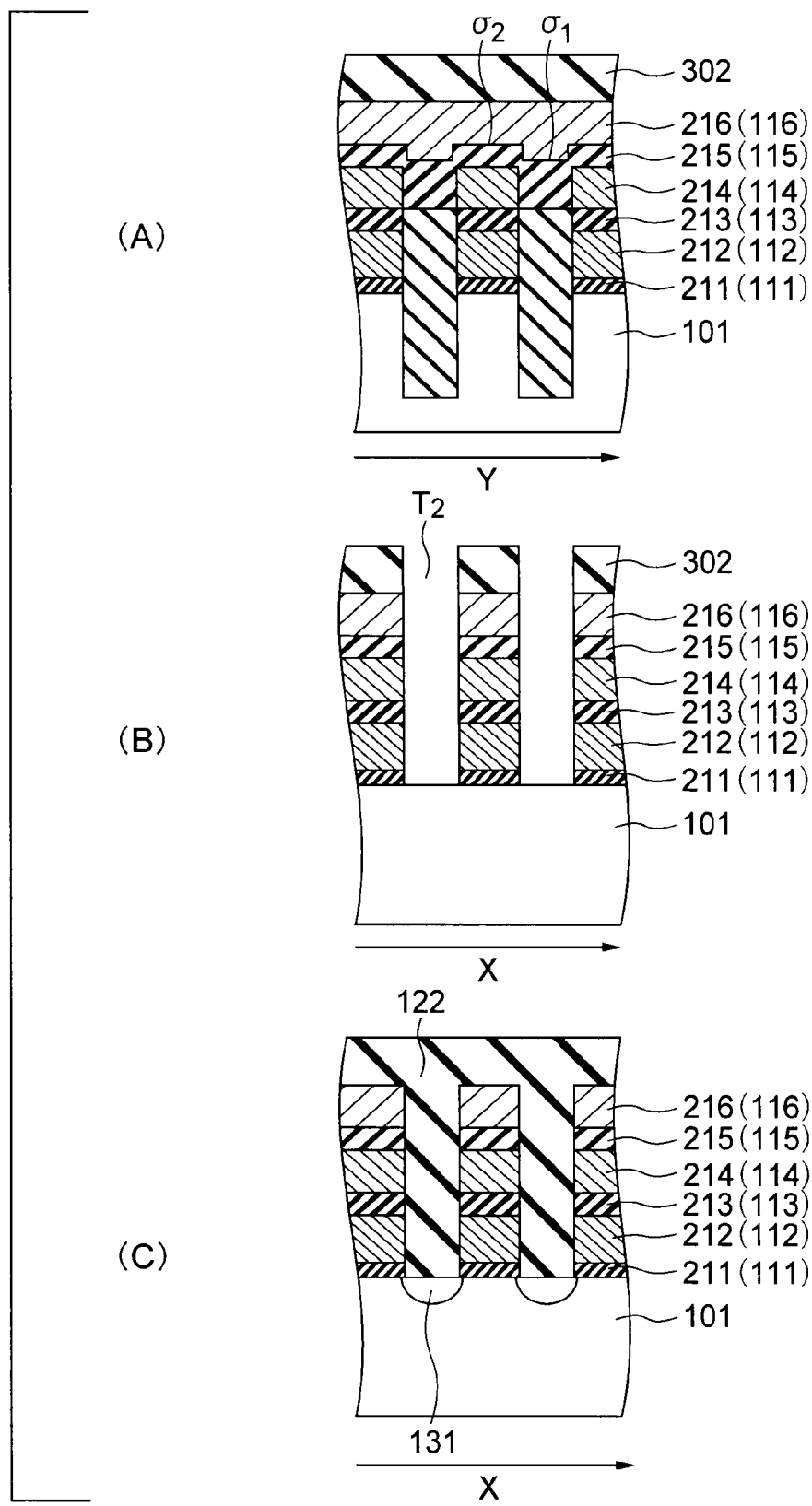

FIGS. 9 and 10 illustrate cross sectional views for explaining the method of manufacturing the semiconductor memory device according to the second embodiment.

First, as shown in FIG. 9(A), a first insulating film 211 as a material of the tunneling insulator 111, a first electrode layer 212 as a material of the lower floating gate 112, a second insulating film 213 as a material of the IFD film 113, a second electrode layer 214 as a material of the upper floating gate 114, and a first mask layer 301 are stacked in this order on the substrate 101.

Next, the first mask layer 301 is patterned by lithography and etching (FIG. 9(B)). Then, first trenches $T_1$ which are isolation trenches are formed by etching using the first mask layer 301.

Next, as shown in FIG. 9(C), the isolation insulators 121 are buried in the first trenches $T_1$. The isolation insulators 121 are buried by depositing the material of the isolation insulators 121 on the entire surface of the substrate 101, and planarizing the surface of the material by CMP. The CMP is performed until the height of the upper surface $S_1$ of each isolation insulator 121 becomes the same as the height of the upper surface $S_2$ of the second electrode layer 214.

In this embodiment, etching is then performed on the isolation insulators 121, so that the upper surface $S_1$ of each isolation insulator 121 becomes lower than the upper surface $S_2$ of the second electrode layer 214 (FIG. 9(C)). This etching is continued until the height of the upper surface of each isolation insulator 121 becomes equal to the height of the upper surface of the second insulating film 213 in this embodiment.

Next, as shown in FIG. 10(A), a third insulating film 215 as a material of the IPD film 115, a third electrode layer 216 as a material of the control gate 116, and a second mask layer 302 are stacked in this order on the second electrode layer 214 and the isolation insulators 121. In FIG. 10(A), since the height of the upper surface $S_1$ is lower than the height of the lower surface $S_2$, the lower surface $\sigma_1$ of the third electrode layer 216 between the cell transistors is lower than the lower surface $\sigma_2$ of the third electrode layer 216 on the first and second electrode layers 212 and 214.

Next, the second mask layer 302 is patterned by lithography and etching (FIG. 10(B)). Then, second trenches $T_2$ are formed by etching using the second mask layer 302.

In this way, the cell transistors, each of which includes the tunneling insulator 111, the lower floating gate 112, the IFD film 113, the upper floating gate 114, the IPD film 115, and the control gate 116, are formed on the substrate 101. Then, the source/drain diffusion layers 131 are formed in the substrate 101, and the inter layer dielectric 122 is formed on the substrate 101 to cover the cell transistors (FIG. 10(C)). Furthermore, contact plugs, via plugs, and various interconnect layers are formed on the substrate 101.

The following is a description of semiconductor memory devices according to modifications of the second embodiment.

Figure 11:
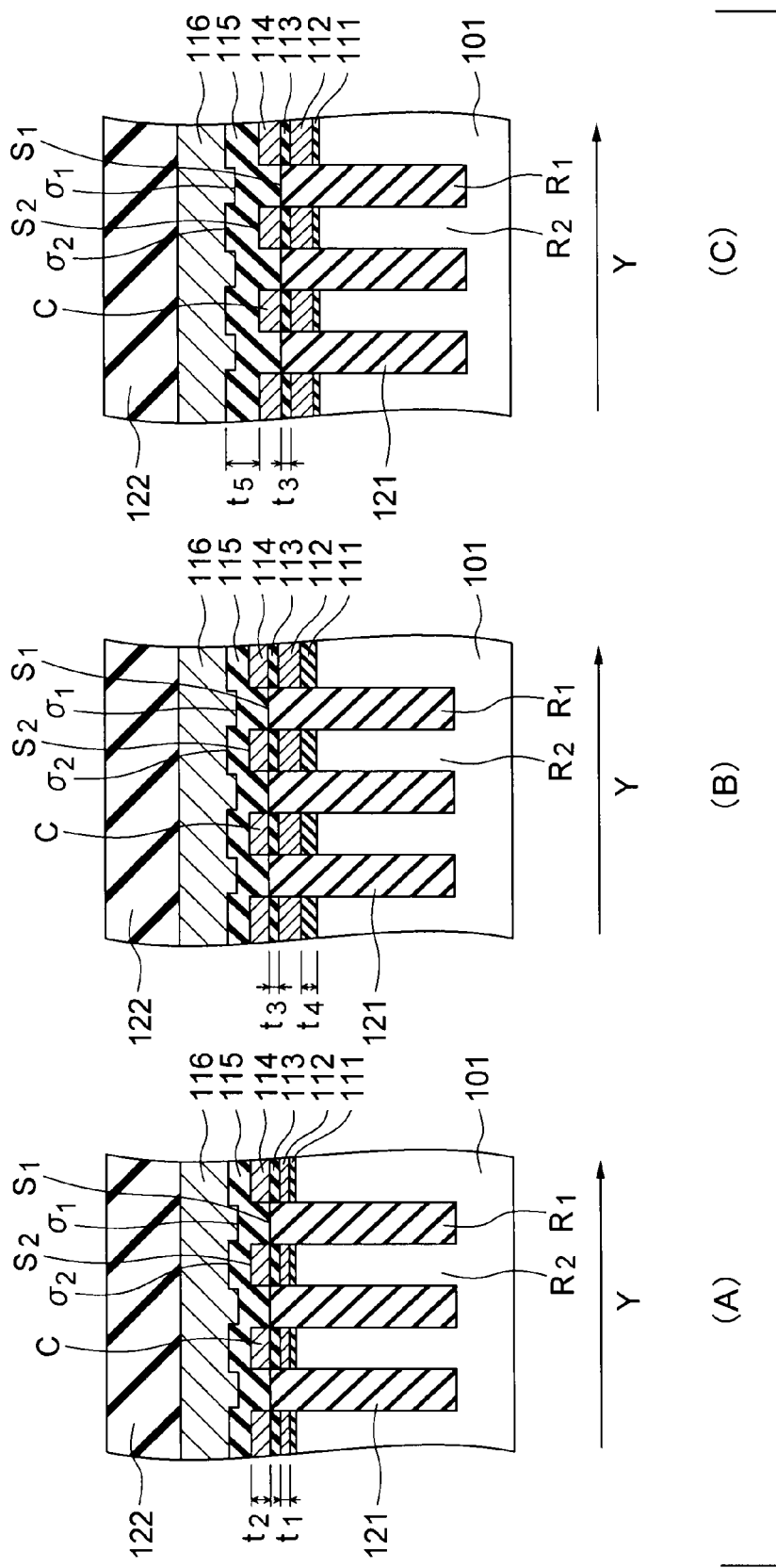
FIG. 11 illustrates cross sectional views showing configurations of semiconductor memory devices according to modifications of the second embodiment.

FIG. 11 illustrates cross sectional views showing configurations of the semiconductor memory devices according to the modifications of the second embodiment.

In FIGS. 11(A) to 11(C), the IPD film 115 and the control gate 116 are shared by cell transistors C adjacent one another in the Y direction. Further, the lower surface $\sigma_1$ of the control gate 116 between the cell transistors C is lower than the lower surface $\sigma_2$ of the control gate 116 on the lower and upper floating gates 112 and 114.

In FIG. 11(A), the thickness $t_2$ of the upper floating gate 114 is greater than the thickness $t_1$ of the lower floating gate 112. With this arrangement, the capacitance between the upper floating gate 114 and the control gate 116 can be increased, and the capacitive coupling can be made stronger. Accordingly, the write characteristics of the cell transistors C can be improved.

In FIG. 11(B), the thickness $t_3$ of the IFD film 113 is smaller than the thickness $t_4$ of the tunneling insulator 111 in effective thickness. With this arrangement, charges can be easily stored in the upper floating gate 114. Accordingly, a large amount of stored charges can be prevented from existing near the substrate 101.

In FIG. 11(C), the thickness $t_3$ of the IFD film 113 is smaller than the thickness $t_5$ of the IPD film 115 in effective thickness. With this arrangement, charges cannot easily escape from the upper floating gate 114 to the control gate 116.

In FIG. 11(C), it is noted that the thickness of the IFD film 113 is smaller than the thickness of the IPD film 115 between the cell transistors C, and is smaller than the thickness of the IPD film 115 on the lower and upper floating gates 112 and 114.

The modifications illustrated in FIGS. 11(A) to 11(C) can also be applied to the first embodiment and the below described third embodiment.

As described above, in this embodiment, the floating gate of each cell transistor is formed with the lower floating gate 112 and the upper floating gate 114, and the IFD film 113 is formed between the lower floating gate 112 and the upper floating gate 114, similarly to the first embodiment. Further, the tunneling insulator 111 and the IFD film 113 are F-N tunneling films, and the IPD film 115 is a charge blocking film, similarly to the first embodiment. With this arrangement, the memory cells can be miniaturized, while the degradation of the performance of the semiconductor memory device is prevented, similarly to the first embodiment. For example, the memory cells can be miniaturized, while the degradation of the write characteristics, the adjacent cell interference, the charge escaping and the like are restrained. As for the write characteristics, the coupling ratio between the upper floating gate 114 and the control gate 116 becomes higher, and the electric field applied to the tunneling insulator 111 increases in this embodiment. Accordingly, the write characteristics of the cell transistors are improved in this embodiment. As for the adjacent cell interference, the capacity of the cells increases, and the coupling ratio becomes higher. Accordingly, the adjacent cell interference is suppressed.

Third Embodiment

Figure 12:
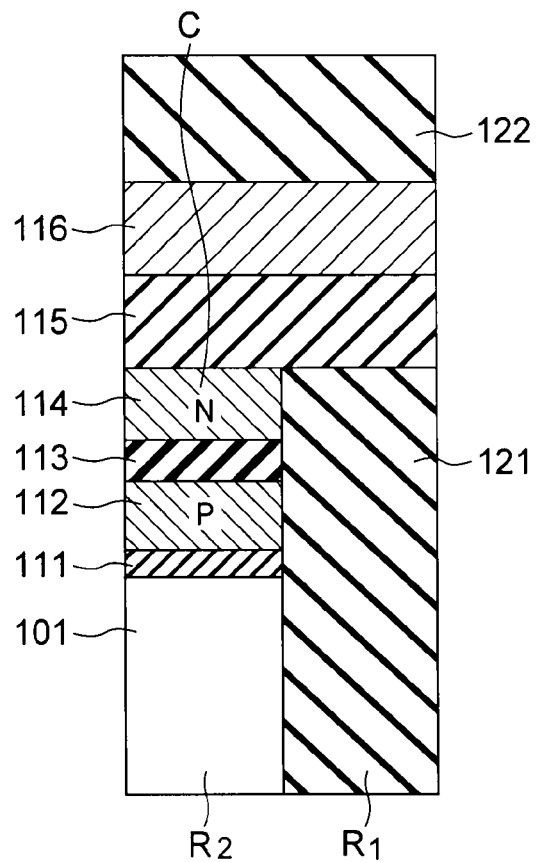
FIG. 12 is a cross sectional view showing a configuration of a semiconductor memory device according to a third embodiment.
Figure 13:
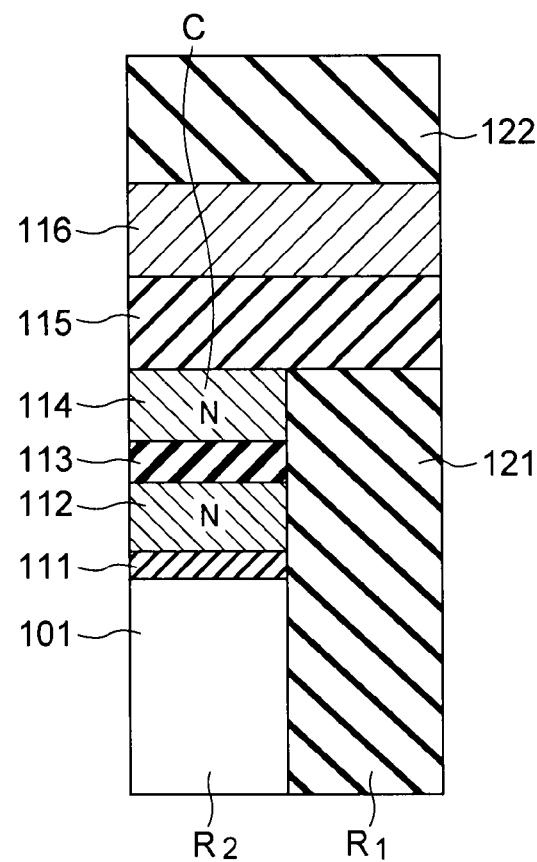
FIG. 13 is a cross sectional view showing a configuration of a semiconductor memory device according to a comparative example.

FIG. 12 is a cross sectional view showing a configuration of a semiconductor memory device according to a third embodiment. FIG. 13 is a cross sectional view showing a configuration of a semiconductor memory device according to a comparative example. FIGS. 12 and 13 show AA sections of the semiconductor memory devices along the section line I of FIG. 1, and show cross sections of cell transistors C.

In the comparative example, the lower floating gate 112 and the upper floating gate 114 are N-type polysilicon layers. However, the cell transistors C of such structures have poor data retention properties.

To counter this problem, the lower floating gate 112 and the upper floating gate 114 in this embodiment are a P-type polysilicon layer and an N-type polysilicon layer, respectively. With this arrangement, the data retention properties can be improved by work functions in this embodiment.

In the first and second embodiments, the lower floating gate 112 and the upper floating gate 114 may be both N-type silicon layers, or may be a P-type polysilicon layer and an N-type polysilicon layer, respectively.

Further, in the first and second embodiments, the lower floating gate 112 and the upper floating gate 114 may be both P-type polysilicon layers, or may be an N-type polysilicon layer and a P-type polysilicon layer, respectively.

In this way, in the first and second embodiments, the lower floating gate 112 and the upper floating gate 114 may be semiconductor layers of the same conductivity type, or may be semiconductor layers of different conductivity types.

The following is a description of an operation of the semiconductor memory device according to this embodiment (FIG. 12).

Figure 14:
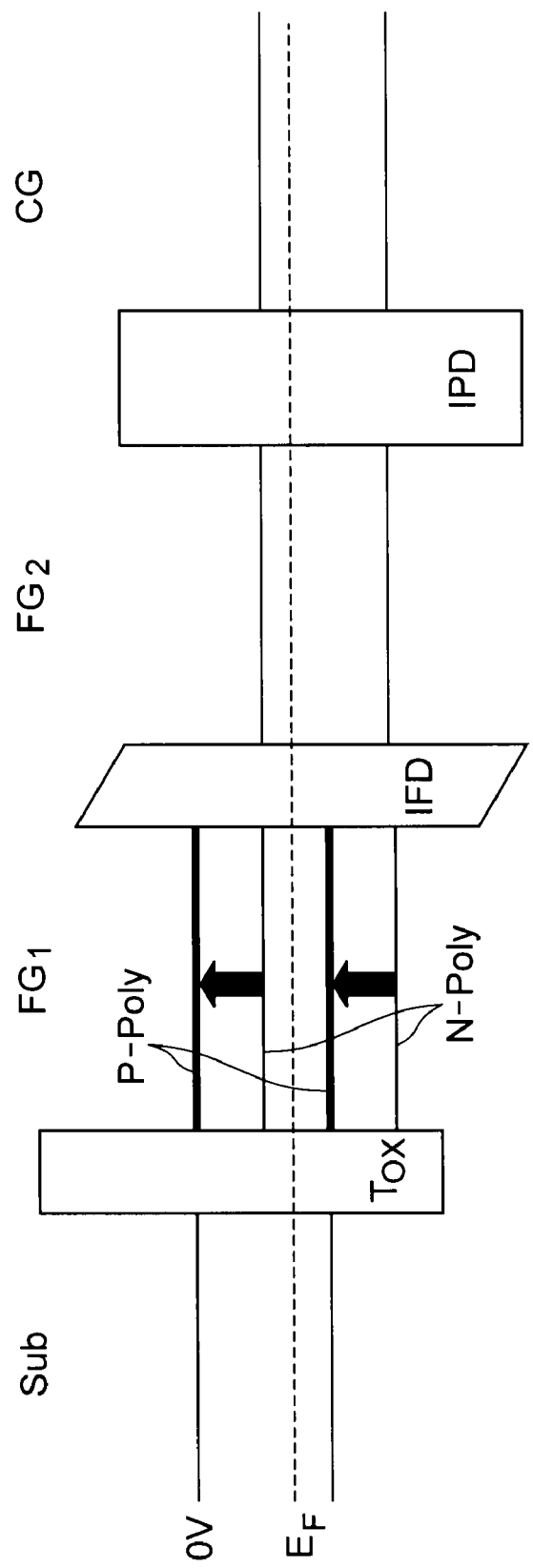
FIG. 14 shows a conceptual view for explaining a state of a cell transistor prior to writing.

FIG. 14 shows a conceptual view for explaining a state of a cell transistor prior to writing. Similarly to FIG. 3, the horizontal direction in FIG. 14 indicates the height direction of the cell transistor, and the vertical direction in FIG. 14 indicates the height direction of the potential inside and outside of the cell transistor.

FIG. 14 illustrates potential barriers of the $T_{ox}$ film (tunneling insulator) 111, the IFD film 113, and the IPD film 115.

In FIG. 14, solid lines indicate the lower edge of the conduction band and the upper edge of the valence band with respect to each of the potentials in the substrate (Sub) 101, the lower floating gate ($FG_1$) 112, the upper floating gate ($FG_2$) 114, and the control gate (CG) 116, and a dotted line indicates the Fermi level.

FIG. 14 illustrates the situation where the lower edge of the conduction band and the upper edge of the valence band of the lower floating gate 112 is elevated from the same potential as the potential of the upper floating gate 114 to the same potential as the potential of the substrate 101 by changing the lower floating gate 112 from an N-type layer to a P-type layer.

Figure 15:
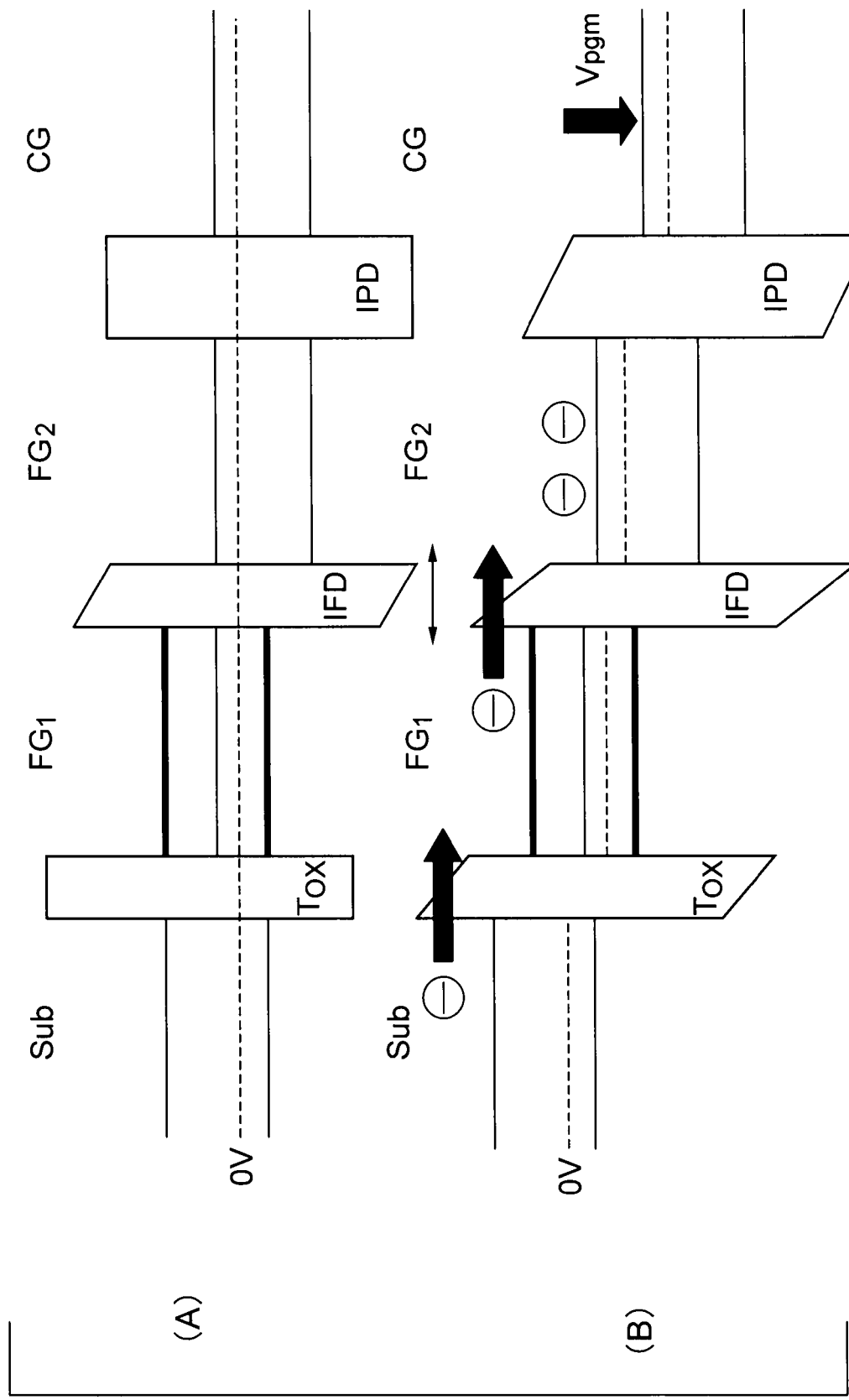
FIG. 15 shows conceptual views for explaining a state of the cell transistor at the time of writing.

FIG. 15 shows conceptual views for explaining a state of the cell transistor at the time of writing.

Similarly to FIG. 14, FIG. 15(A) illustrates the state of the cell transistor prior to writing. At the time of writing, the voltage of the control gate 116 is set at Vpgm, as shown in FIG. 15(B). In this embodiment, by changing the lower floating gate 112 from an N-type layer to a P-type layer, the potential difference $E_{IFD}$ between the upper surface and the lower surface of the IFD film 113 becomes larger, so that electrons can be more easily injected into the upper floating gate 114.

Figure 16:
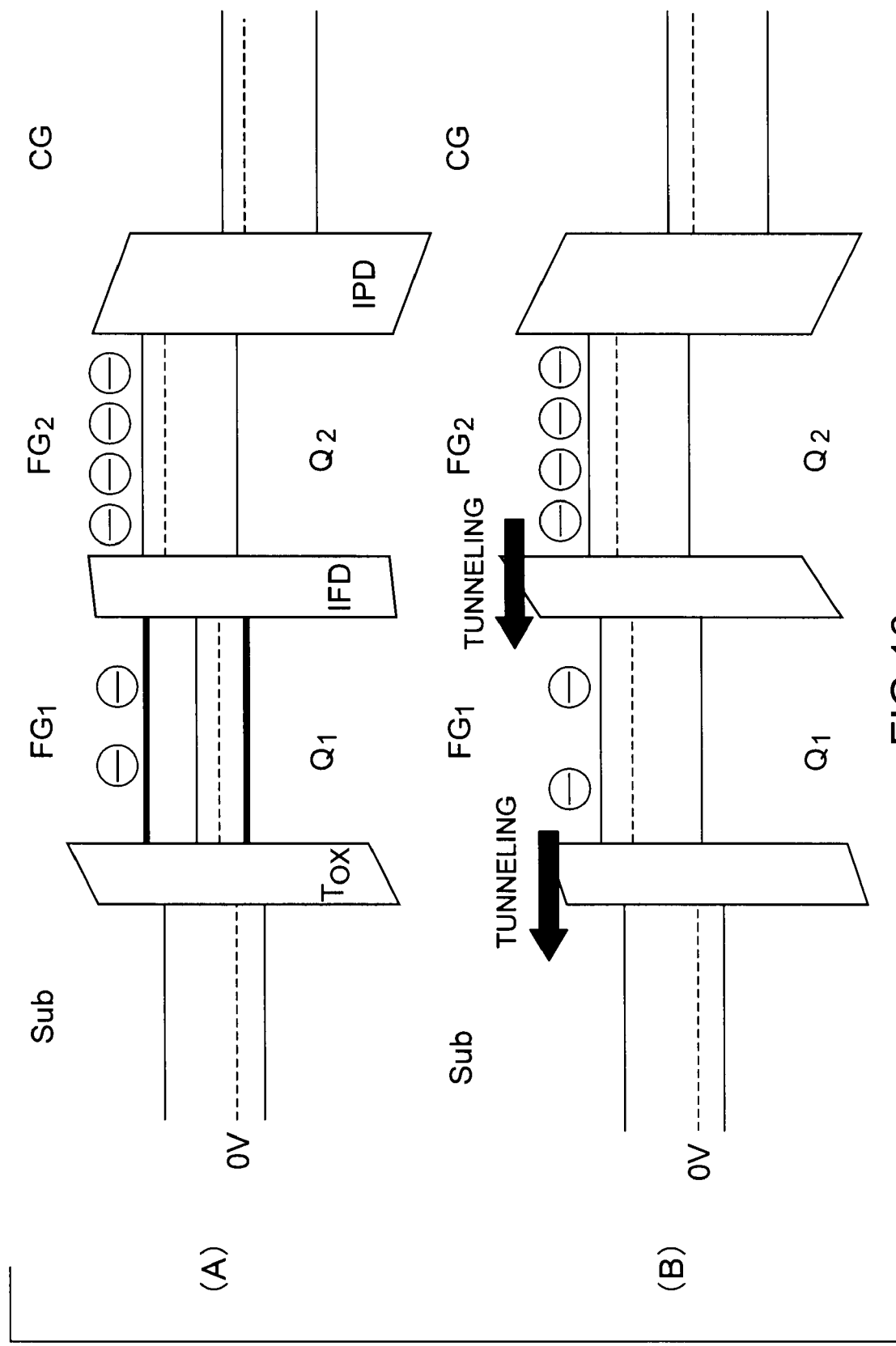
FIG. 16 shows conceptual views for explaining a state of the cell transistor at the time of retention.

FIG. 16 shows conceptual views for explaining a state of the cell transistor at the time of retention.

FIGS. 16(A) and 16(B) respectively illustrate the states of the cell transistor at the time of retention observed where the lower floating gate 112 is a P-type layer and where the lower floating gate 112 is an N-type layer. In this embodiment, by changing the lower floating gate 112 from an N-type layer to a P-type layer, the potential difference $E_{IFD}$ is made smaller, so that the electrons injected into the upper floating gate 114 do not easily escape, as shown in FIG. 16(A). On the other hand, FIG. 16(B) illustrates a situation where the electrons easily escape from the upper floating gate 114 to the lower floating gate 112 and from the lower floating gate 112 to the substrate 101.

Figure 17:
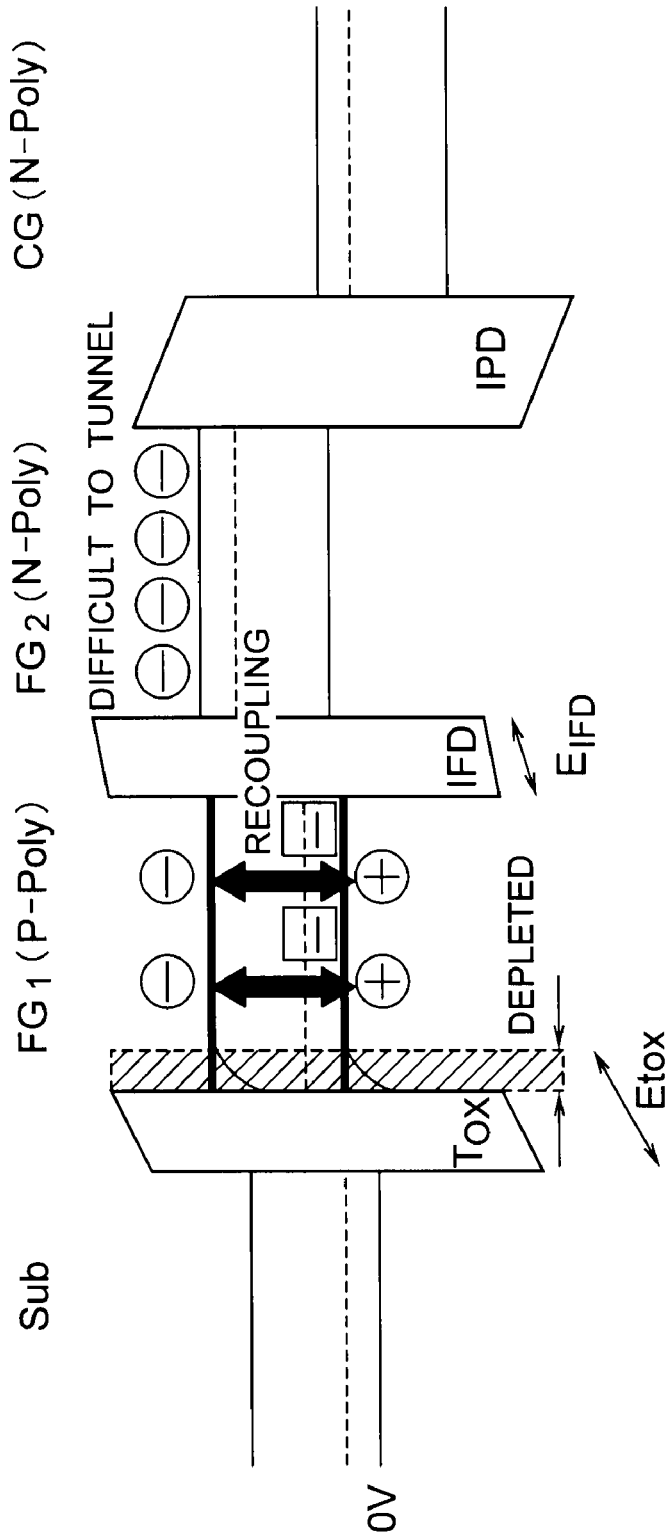
FIG. 17 is a conceptual view for explaining effects of the third embodiment.

FIG. 17 is a conceptual view for explaining effects of the third embodiment.

First, since the potential difference $E_{IFD}$ is made smaller in this embodiment, the electrons injected into the upper floating gate 114 do not easily escape to the lower floating gate 112. Secondly, when electrons are stored in the lower floating gate 112, the electrons are coupled to holes, so that free electrons disappear and polarized electrons are generated. As a result, the electrons inside the lower floating gate 112 do not easily escape into the substrate 101. Thirdly, since the lower portion of the lower floating gate 112 is depleted, the potential difference $E_{tox}$ between the upper surface and the lower surface of the $T_{ox}$ film 111 becomes smaller. Accordingly, the electrons inside the lower floating gate 112 do not easily escape into the substrate 101.

As described above, in this embodiment, the lower floating gate 112 and the upper floating gate 114 are semiconductor layers of different conductivity types from each other. With this arrangement, the data retention properties of the cell transistors can be improved in this embodiment.

(Modifications)

The following is a description of modifications of the semiconductor memory devices according to the first to third embodiments.

The widths of the active region $R_2$, the tunneling insulator 111, the lower floating gate 112, the IFD film 113, and the upper floating gate 114 in the Y direction (direction parallel to the wordlines) are the same in the first to third embodiments (see FIGS. 2(A), 8(A), and 12(A)). However, the widths of those layers may be set at different values as shown in FIG. 18.

Figure 18:
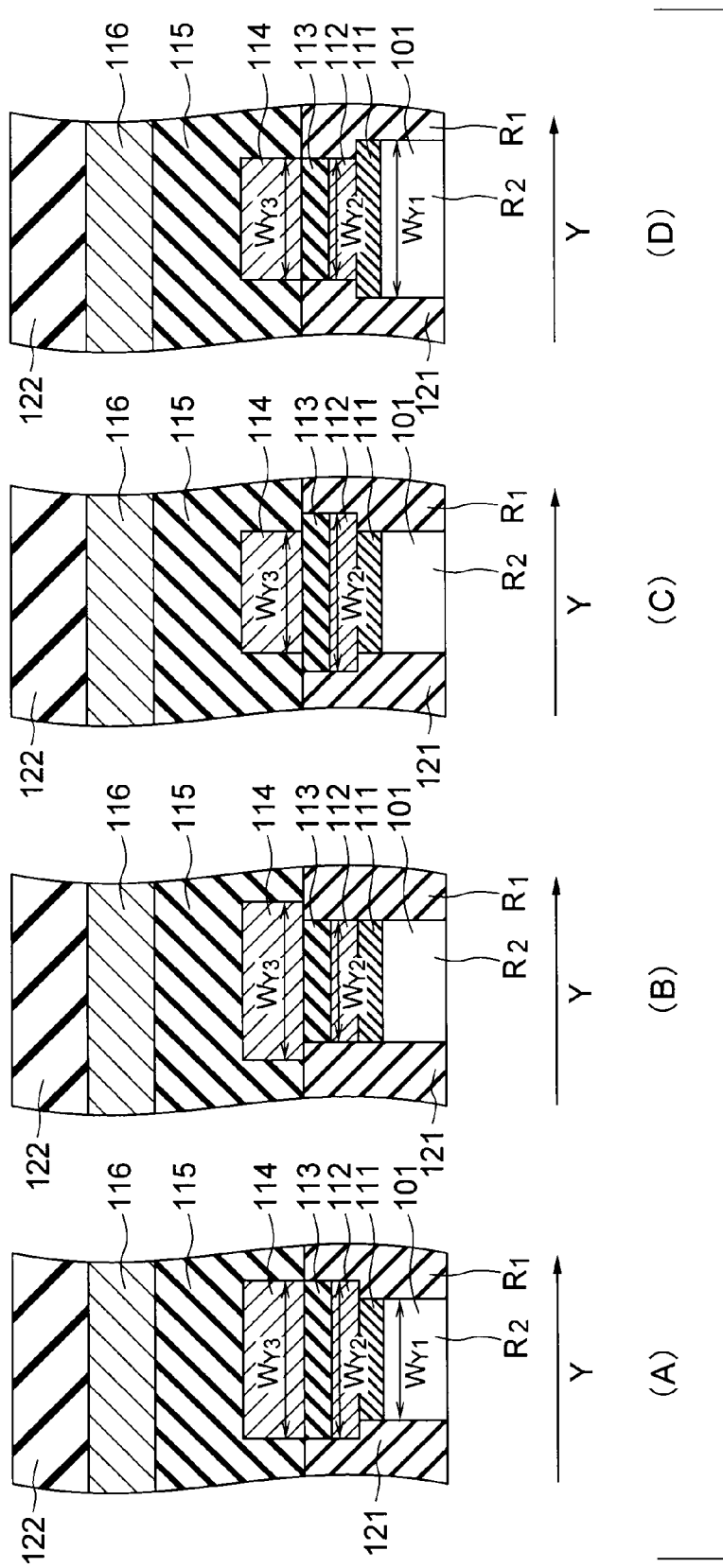
FIGS. 18 and 19 illustrate cross sectional views showing configurations of semiconductor memory devices according to modifications of the first to third embodiments.

FIG. 18 illustrates cross sectional views showing configurations of semiconductor memory devices according to modifications of the first to third embodiments. FIGS. 18(A) to (D) show AA sections along the section line I of FIG. 1, and show cross sections of cell transistors C.

In FIGS. 18(A) to 18(D), the widths of the active region $R_2$, the lower floating gate 112, and the upper floating gate 114 in the Y direction are denoted by $W_{y1}$, $W_{y2}$, and $W_{y3}$, respectively.

In FIG. 18(A), the widths $W_{y2}$ and $W_{y3}$ of the lower floating gate 112 and the upper floating gate 114 in the Y direction are greater than the width $W_{y1}$ of the active region $R_2$ in the Y direction. In FIG. 18(D), on the other hand, the widths $W_{y2}$ and $W_{y3}$ of the lower floating gate 112 and the upper floating gate 114 in the Y direction are smaller than the width $W_{y1}$ of the active region $R_2$ in the Y direction.

In FIG. 18(B), the width $W_{y3}$ of the upper floating gate 114 in the Y direction is greater than the width $W_{y2}$ of the lower floating gate 112 in the Y direction. In FIG. 18(C), on the other hand, the width $W_{y3}$ of the upper floating gate 114 in the Y direction is smaller than the width $W_{y2}$ of the lower floating gate 112 in the Y direction.

In this way, in the modifications illustrated in FIG. 18, the widths of the active region $R_2$, the tunneling insulator 111, the lower floating gate 112, the IFD film 113, and the upper floating gate 114 in the Y direction can be set at various values, depending on the designs of the semiconductor memory devices and the like.

Likewise, the widths of the tunneling insulator 111, the lower floating gate 112, the IFD film 113, the upper floating gate 114, the IPD film 115, and the control gate 116 in the X direction (direction parallel to the bitlines) are the same in the first to third embodiments (see FIGS. 2(B) and 8(B)). However, the widths of those layers may be set at different values as shown in FIG. 19.

Figure 19:
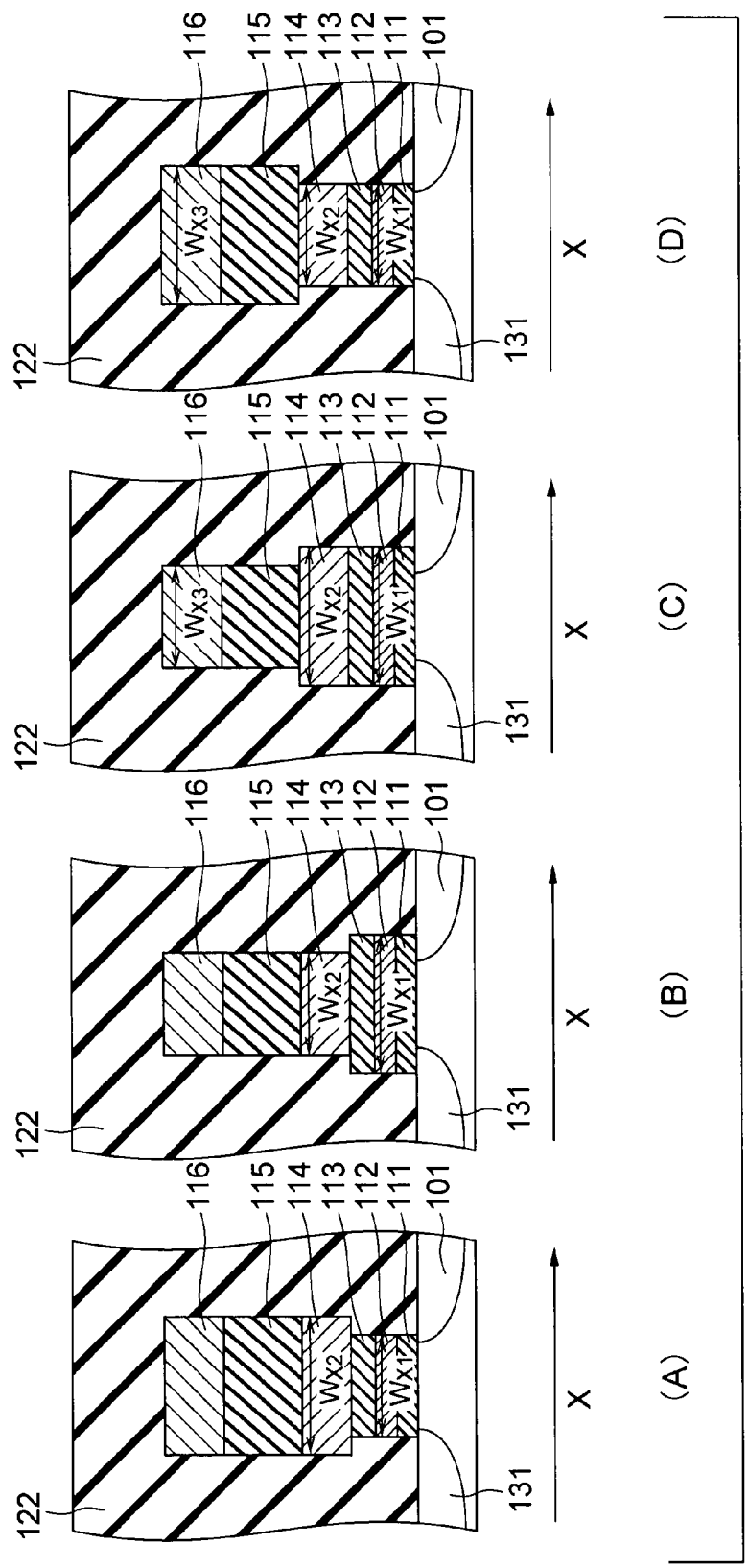

FIG. 19 illustrates cross sectional views showing configurations of semiconductor memory devices according to modifications of the first to third embodiments. FIGS. 19(A) to 19(D) show GC sections along the section line II of FIG. 1, and shows cross sections of cell transistors C.

In FIGS. 19(A) to 19(D), the widths of the lower floating gate 112, the upper floating gate 114, and the control gate 116 in the X direction are denoted by $W_{X1}$, $W_{X2}$, and $W_{X3}$, respectively.

In FIG. 19(C), the widths $W_{X1}$ and $W_{X2}$ of the lower floating gate 112 and the upper floating gate 114 in the X direction are greater than the width $W_{X3}$ of the control gate 116 in the X direction. In FIG. 19(D), on the other hand, the widths $W_{X1}$ and $W_{X2}$ of the lower floating gate 112 and the upper floating gate 114 in the X direction are smaller than the width $W_{X3}$ of the control gate 116 in the X direction.

In FIG. 19(A), the width $W_{X2}$ of the upper floating gate 114 in the X direction is greater than the width $W_{X1}$ of the lower floating gate 112 in the X direction. In FIG. 19(B), on the other hand, the width $W_{X2}$ of the upper floating gate 114 in the X direction is smaller than the width $W_{X1}$ of the lower floating gate 112 in the X direction.

In this way, in the modifications illustrated in FIG. 19, the widths of the tunneling insulator 111, the lower floating gate 112, the IFD film 113, the upper floating gate 114, the IPD film 115, and the control gate 116 in the X direction can be set at various values, depending on the designs of the semiconductor memory devices and the like.

Any of the modifications illustrated in FIG. 18 may be combined with any of the modifications illustrated in FIG. 19.

As described above, the embodiments of the present invention can provide a semiconductor memory device in which memory cells can be miniaturized while a degradation of a performance of the semiconductor memory device is suppressed.

Although specific examples of the present invention have been described in the first to third embodiments, the present invention is not limited to those embodiments.

The invention claimed is:

1. A semiconductor memory device comprising:
   a substrate;
   a gate insulator formed on the substrate and serving as an F-N (Fowler-Nordheim) tunneling film in a writing operation;
   a first floating gate formed on the gate insulator;
   a first intergate insulator formed on the first floating gate and serving as an F-N tunneling film in the writing operation;
   a second floating gate formed on the first intergate insulator;
   a second intergate insulator formed on the second floating gate and serving as a charge blocking film; and
   a control gate formed on the second intergate insulator.

2. The device according to claim 1, further comprising:
   a plurality of bitlines extending in a first direction parallel to a surface of the substrate;
   a plurality of wordlines extending in a second direction parallel to the surface of the substrate; and
   a plurality of cell transistors, each of which includes the gate insulator, the first floating gate, the first intergate insulator, the second floating gate, the second intergate insulator, and the control gate, and is electrically connected to one of the bitlines and one of the wordlines.

3. The device according to claim 2, wherein the second intergate insulator and the control gate are shared by the cell transistors adjacent to one another in a direction parallel to the wordlines.

4. The device according to claim 3, wherein a height of a lower surface of the control gate between the cell transistors is substantially equal to a height of a lower surface of the control gate on the first and second floating gates.

5. The device according to claim 3, wherein a height of a lower surface of the control gate between the cell transistors is lower than a height of a lower surface of the control gate on the first and second floating gates.

6. The device according to claim 2, further comprising: isolation regions and active regions alternately provided in the substrate and extending in a direction parallel to the bitlines,
   wherein
   the first and second floating gates are formed on an active region, and
   a width of the first floating gate and a width of the second floating gate in a direction parallel to the wordlines are greater than a width of the active region in the direction parallel to the wordlines.

7. The device according to claim 2, further comprising: isolation regions and active regions alternately provided in the substrate and extending in a direction parallel to the bitlines,
   wherein
   the first and second floating gates are formed on an active region, and
   a width of the first floating gate and a width of the second floating gate in a direction parallel to the wordlines are smaller than a width of the active region in the direction parallel to the wordlines.

8. The device according to claim 2, wherein a width of the second floating gate in a direction parallel to the wordlines is greater or smaller than a width of the first floating gate in the direction parallel to the wordlines.

9. The device according to claim 2, wherein a width of the first floating gate and a width of the second floating gate in a direction parallel to the bitlines are greater than a width of the control gate in the direction parallel to the bitlines.

10. The device according to claim 2, wherein a width of the first floating gate and a width of the second floating gate in a direction parallel to the bitlines are smaller than a width of the control gate in the direction parallel to the bitlines.

11. The device according to claim 2, wherein
a width of the second floating gate in a direction parallel to the bitlines is greater or smaller than a width of the first floating gate in the direction parallel to the bitlines.

12. The device according to claim 2, wherein
when data is read from a selected cell which is selected from the cell transistors, a voltage higher than a read voltage is applied to a wordline electrically connected to the selected cell, prior to the reading.

13. The device according to claim 12, wherein
when the data is read from the selected cell, the read voltage is applied to the wordline electrically connected to the selected cell, and a sense voltage lower than the read voltage is applied to a bitline electrically connected to the selected cell.

14. The device according to claim 12, wherein
the voltage applied to the wordline prior to the reading is lower than a write voltage applied for writing the data into the selected cell.

15. The device according to claim 1, wherein
a thickness of the second floating gate is greater than a thickness of the first floating gate.

16. The device according to claim 1, wherein
an effective thickness of the first intergate insulator is smaller than an effective thickness of the gate insulator.

17. The device according to claim 1, wherein
an effective thickness of the first intergate insulator is smaller than an effective thickness of the second intergate insulator.

18. The device according to claim 1, wherein
the first and second floating gates are semiconductor layers of the same conductivity type.

19. The device according to claim 1, wherein
the first and second floating gates are semiconductor layers of different conductivity types.

20. The device according to claim 1, wherein
a thickness of the gate insulator and a thickness of the first intergate insulator is equal to or greater than 3 nm in equivalent silicon oxide thickness.

* * * * *